(12) United States Patent
Seebacher et al.

(10) Patent No.: US 8,970,295 B2
(45) Date of Patent: Mar. 3, 2015

(54) SYSTEM AND METHOD FOR A POWER AMPLIFIER

(75) Inventors: David Seebacher, Villach (AT); Peter Singerl, Villach (AT); Christian Schuberth, Villach-Landskron (AT); Martin Mataln, Villach (AT)

(73) Assignee: Infineon Technologies AG, Neubiberg (DE)

( * ) Notice: Subject to any disclaimer, the term of this patent is extended or adjusted under 35 U.S.C. 154(b) by 49 days.

(21) Appl. No.: 13/603,313

(22) Filed: Sep. 4, 2012

(65) Prior Publication Data

US 2014/0062604 A1 Mar. 6, 2014

(51) Int. Cl.
*H03F 3/38* (2006.01)
*H03F 3/217* (2006.01)

(52) U.S. Cl.
CPC ..................... *H03F 3/217* (2013.01)
USPC .......................................... 330/10

(58) Field of Classification Search
USPC ............. 330/10, 207 A, 251; 375/238, 297
See application file for complete search history.

(56) References Cited

U.S. PATENT DOCUMENTS

| 5,729,175 | A | 3/1998 | Ferrer |
| 7,187,239 | B2 | 3/2007 | Yeh |
| 7,236,055 | B2 | 6/2007 | Halbert et al. |
| 7,679,434 | B2 | 3/2010 | Reynaert et al. |
| 8,058,927 | B2 * | 11/2011 | Potscher et al. ............... 330/10 |
| 8,064,856 | B2 * | 11/2011 | Singerl et al. ............. 455/127.1 |
| 2004/0263245 | A1 * | 12/2004 | Winter et al. .................. 330/10 |
| 2009/0270056 | A1 * | 10/2009 | Singerl et al. ............. 455/127.1 |
| 2010/0054325 | A1 | 3/2010 | Sjostrom |
| 2013/0235923 | A1 | 9/2013 | Schuberth et al. |
| 2014/0002192 | A1 | 1/2014 | Seebacher et al. |

OTHER PUBLICATIONS

Agrawal, V., et al., "Mutually Disjoint Signals and Probability Calculation in Digital Circuits," IEEE Proceedings of the 8th Great Lakes Symposium on VLSI, pp. 307-312, Feb. 19-21, 1998.
Amin, A.M.A., et al., "Exploring Aliasing Distortion Effects on Regularly-Sampled PWM Signals," 3rd IEEE Conference on Industrial Electronics and Applications, Jun. 3-5, 2008, pp. 2036-2041, Singapore.
Guinee, R.A., "A Novel Fourier Series Simulation Tool for Pulsewidth Modulation (PWM) in Pulsed Power Systems," Conference Proceedings Applied Power Electronics Conference and Exposition, Feb. 15-19, 1998, pp. 123-128, vol. 1. Cork, Ireland.
Gustavsson, U., et al., "A General Method for Passband Quantization Noise Suppression in Pulsed Transmitter Architectures," IMS Jun. 7-12, 2009, pp. 1529-1532, Stockholm, Sweden.
Gwee, B-H., et al., "A Micropower Low-Distortion Digital Class-D Amplifier Based on an Algorithmic Pulsewidth Modulator," IEEE Transactions on Circuits and Systems, Oct. 2005, pp. 2007-2022, vol. 52, No. 10.

(Continued)

*Primary Examiner* — Khanh V Nguyen
(74) *Attorney, Agent, or Firm* — Slater & Matsil, L.L.P.

(57) ABSTRACT

In accordance with an embodiment, a system includes a first amplifier and a first bandpass filter having an input coupled in series with an output of the first amplifier, and an output configured to be coupled to a load. The bandpass filter has a lower input impedance at an in-band center frequency than at out-of-band frequencies, and the first amplifier is configured to receive a pulse width modulated waveform filtered according to a first transfer function that attenuates sidebands of the pulse width modulated waveform.

27 Claims, 28 Drawing Sheets

(56) References Cited

OTHER PUBLICATIONS

Chi, S., et al., "The Frequency Spectrum of Polar Modulated PWM Signals and the Image Problem," ICECS, Dec. 12-15, 2010, pp. 679-682, IEEE.

Kimball, D.F., et al., "High-Efficiency Envelope-Tracking W-CDMA Base-Station Amplifier Using GaN HFETs," IEEE Transactions on Microwave Theory and Techniques, vol. 54, No. 11, Nov. 2006, 9 pages.

Lee, Yong-Sub et al., "A High-Efficiency Class-E GaN HEMT Power Amplifier for WCDMA Applications," IEEE Microwave and Wireless Components Letters, vol. 17, No. 8, Aug. 2007, 3 pages.

Santi, S., et al., "Spectral Aliasing Effects of PWM Signals with Time-Quantized Switching Instants," Proceedings of the 2004 International Symposium on Circuits and Systems, May 23-26, 2004, pp. IV-689-IV-692.

Song, Z., et al., "The Frequency Spectrum of Pulse Width Modulated Signals," Jun. 2, 2003, pp. 1-39.

Wilkinson, E.J., "An N-Way Hybrid Power Divider," IRE Transactions on Microwave Theory and Techniques, pp. 116-118, Jun. 1959.

Xu, H., et al., "A High-Efficiency Class-E GaN HEMT Power Amplifier at 1.9 GHz," IEEE Microwave and Wireless Components Letters, vol. 16, No. 1, Jan. 2006, 3 pages.

\* cited by examiner

SYSTEM AND METHOD FOR A POWER AMPLIFIER

TECHNICAL FIELD

This invention relates generally to semiconductor circuits and methods, and more particularly to a system and method for a power amplifier.

BACKGROUND

As low-power mobile communication systems have become more common, there has been increased market pressure to reduce power in both mobile stations and in base stations. Such a reduction in power not only allows for lower energy costs, but also allows for lower cost and more compact circuit implementations. As the power consumption of transmission equipment is reduced, there is a corresponding reduction in the need for cooling equipment and for electronic components that are performance rated for high temperature operation. Moreover, lower power equipment is often physically smaller than their higher power consuming counterparts.

In a radio frequency (RF) transmission system, one of the primary power consumers is the RF power amplifier. In some systems, a power efficient signaling scheme is used to increase the efficiency of the systems. For example, the constant envelope Gaussian Minimum Shift Keying (GMSK) used in GSM systems is very efficient because the power amplifier may be operated closer to compression, and/or because the GSM signaling scheme lends itself toward the use of highly efficient power amplifiers, such as Class E amplifiers.

As the need for high data bandwidths are increasing, however, more systems, such as LTE and WiMAX are utilizing signaling schemes that have high peak to average power ratios (PAPR). While these high PAPR signaling schemes are highly bandwidth efficient, they generally consume more power than some power efficient signaling schemes because the power amplifier that transmit signals with high PAPR are operated in a less efficient back-off condition.

SUMMARY OF THE INVENTION

In accordance with an embodiment, a system includes a first amplifier and a first bandpass filter having an input coupled in series with an output of the first amplifier, and an output configured to be coupled to a load. The bandpass filter has a lower input impedance at an in-band center frequency than at out-of-band frequencies, and the first amplifier is configured to receive a pulse width modulated waveform filtered according to a first transfer function that attenuates sidebands of the pulse width modulated waveform The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6a-f illustrate further performance graphs of the embodiment amplifier of FIG. 5a;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a power amplifier for use with baseband and RF transmission systems. The invention may also be applied, however, to other types of circuits and systems, such as audio systems, communication systems, and other electronic or optical systems.

In an embodiment, a power amplifier includes a filter directly connected to an output of a power amplifier that is driven by a pulse width modulated carrier signal. The PWM signal is predistorted in order to generate the desired voltage waveform at the output of the amplifier (before the filter). A combination of the predistorted drive signal and a high out of band impedance of a series resonant filter coupled to the output of the power amplifier reduces power dissipated by the sidebands of the pulse width modulated signals, thereby enabling more power efficient operation. In some embodiments, the power consumption of the power amplifier is reduced according to a state of the pulsewidth modulated signal, thereby enabling efficient operation.

Figure 1A:
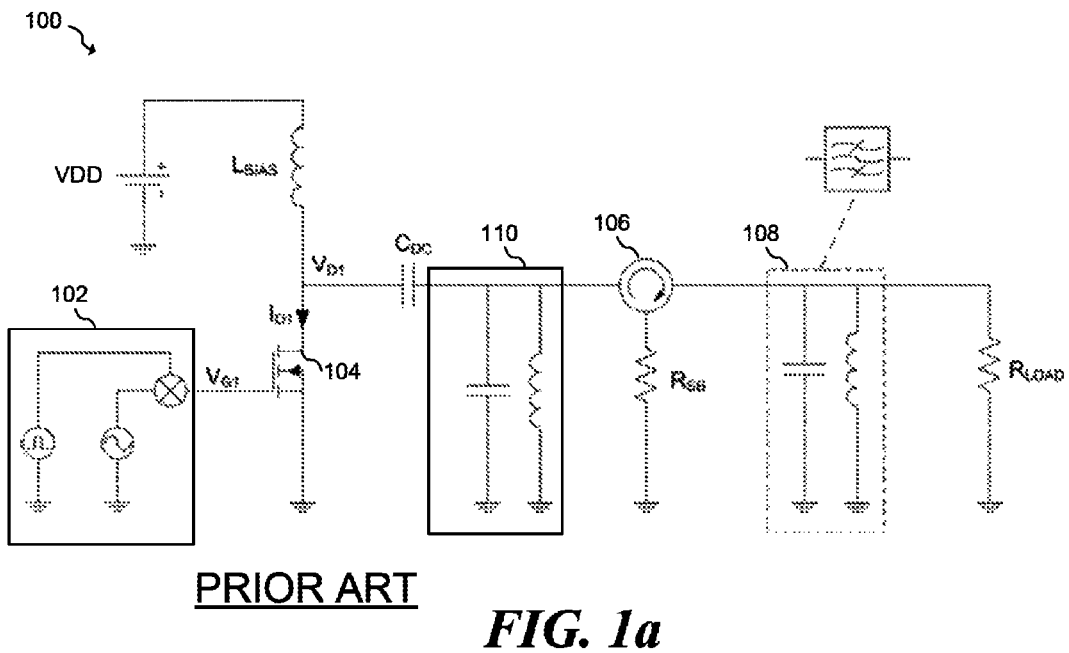
FIGS. 1a-d illustrate a conventional power amplifier circuit schematic and associated performance graphs.

FIG. 1a illustrates conventional power amplifier system 100 that includes pulse width modulation (PWM) generator 102, transistor 104, bias inductor $L_{BIAS}$, LC tank 110, circulator or isolator 106, parallel resonant output filter 108 and a load represented by resistor $R_{LOAD}$. Output filter 108 is coupled to transistor 104 via isolator or circulator 106 that is terminated by resistor $R_{SB}$. Thus, the drain of transistor 104 sees a matched impedance for modulation sidebands of the PWM signal generated by PWM generator 102. As such, sidebands of the PWM signal see the load impedance and sideband energy is dissipated by sideband resistor $R_{SB}$. LC tank 110 provides a short circuit or low impedance for the higher order harmonics of the carrier and an open circuit for the modulation sidebands.

Figure 1B:
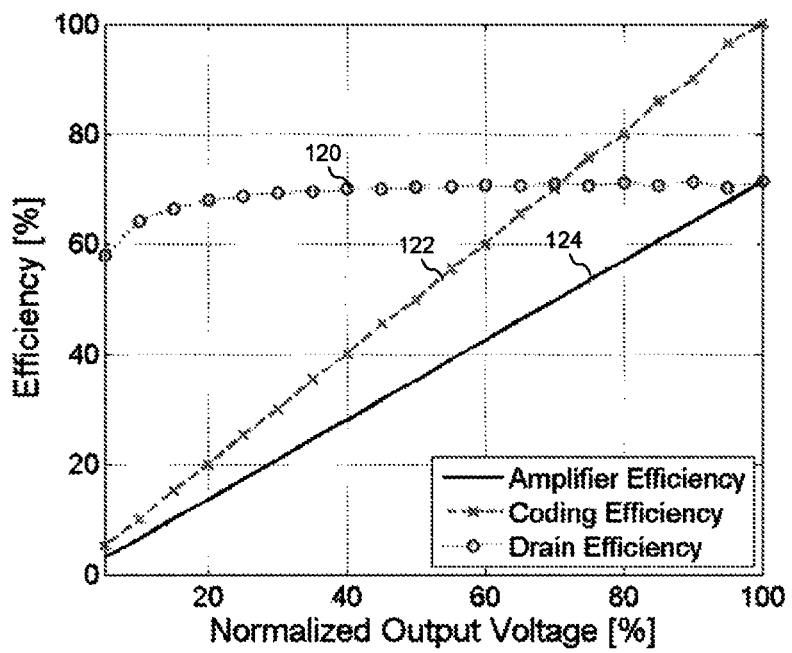

FIG. 1b illustrates a plot of the efficiency of conventional system 100 vs. normalized output voltage. It can be seen that drain efficiency 120 of the amplifier, which is defined as the ratio of the total power output by transistor 104 to the DC input power, is approximately constant over the duty cycle, assuming that the drain voltage of transistor 104 is pulsed. Hence the amplifier may be operated at an efficient point. Coding efficiency 122, which is defined as the ratio of the in band energy to the overall energy of the drain signal, increases linearly with the duty cycle. Resulting amplifier efficiency 124 is the product of drain efficiency 120 and coding efficiency 122 and shows a similar curve as a conventional class B amplifier.

Figure 1C:
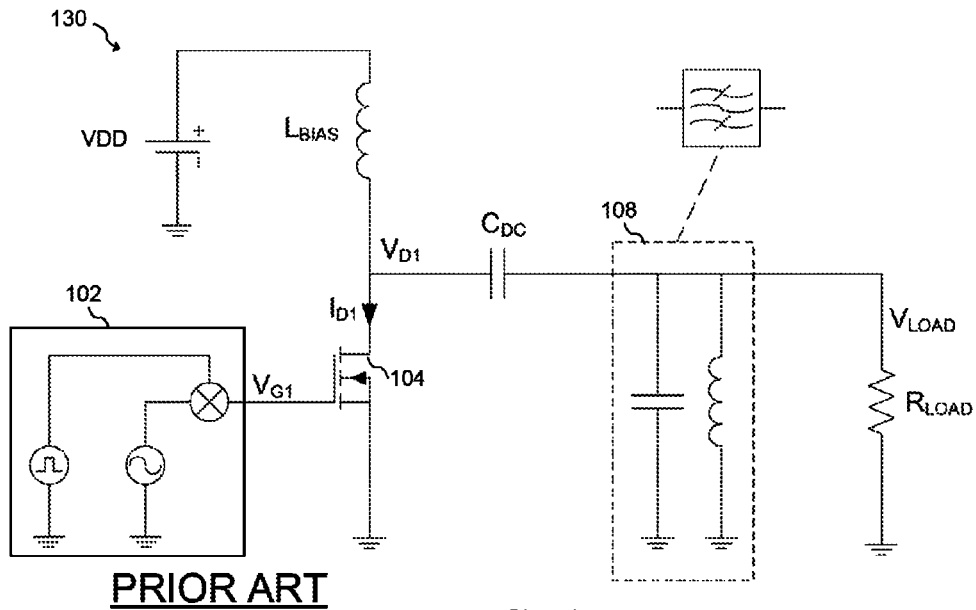

FIG. 1c illustrates further conventional power amplifier system 130 in which parallel resonant output filter 108 is connected to the drain of transistor 104 via capacitor $C_{DC}$ without an isolator or circulator. Output filter 108 has a characteristic that out of band signal components see a short circuit; therefore, modulation sidebands of the PWM signal generated by PWM generator 102 also see a short circuit. Thus, the PWM modulated current of transistor 104 results in a demodulated drain voltage of transistor 104. Due to this demodulated voltage, power amplifier 130 may not operate at maximum voltage swing, thereby leading to a loss in efficiency.

Figure 1D:
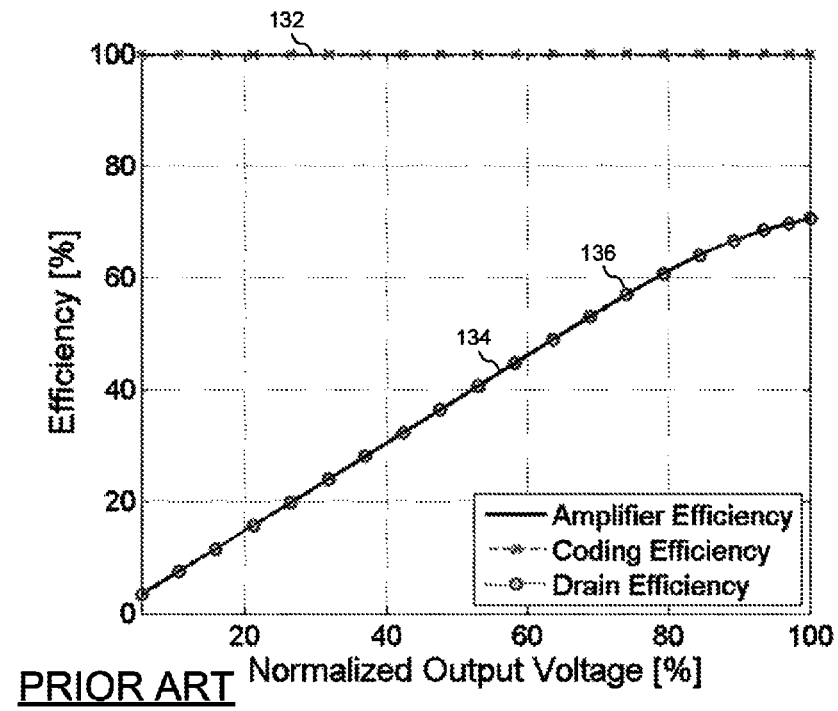

FIG. 1d illustrates a plot of the efficiency of conventional system 130 vs. normalized output voltage. Here, resulting efficiency curve 134 is similar to a conventional class B amplifier. Coding efficiency 132 is almost 100% because very little energy is lost in the sidebands. Drain efficiency 136 is dominant for the amplifier performance as the drain voltage varies with the duty cycle.

Figure 2A:
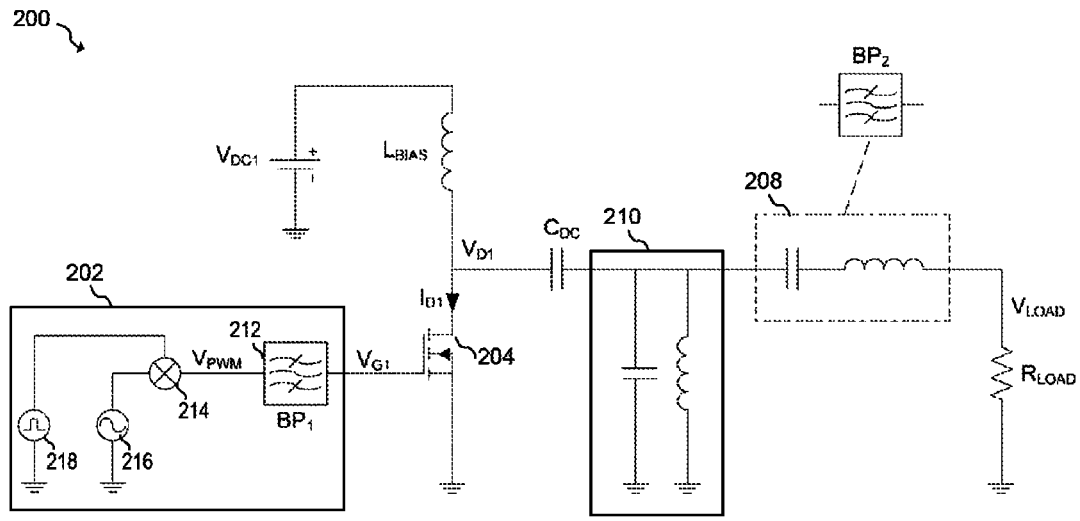
FIGS. 2a-g illustrate an embodiment power amplifier and associated performance graphs.

FIG. 2a illustrates power amplifier system 200 according to an embodiment of the present invention. Here, the drain of transistor 204 is coupled to the load represented by resistor $R_{LOAD}$ by output filter 208, and the gate of transistor 204 is coupled to signal generation circuit 202 represented by bandpass filter 212 and a pulse width modulator represented by pulse generator 218, signal generator 216 and mixer 214. Resonator 210 provides a short circuit for the higher order harmonics and an open circuit for the modulation sidebands of the PWM signal.

In embodiments of the present invention, the pulsewidth modulation and bandpass filtering functions of signal generation circuit 202 may be implemented using various techniques known in the art. For example, in one embodiment, pulse width modulated signal $V_{PWM}$ may be generated using digital circuitry and bandpass filter 212 may be implemented using an analog bandpass filter coupled to the gate of transistor 204. Alternatively, the filtering function of bandpass filter 212 may also be implemented in the digital domain. In some embodiments, the filtering function of bandpass filter 212 may be applied at baseband after the baseband signal is pulse width modulated.

By using a series resonant circuit for output filter 208, modulation sidebands of the PWM signal see a high impedance, thereby significantly reducing power lost to sideband power dissipation. Output filter 208 may be implemented using a series LC circuit as shown, or may be implemented using a single or multiple resonators. In some embodiments, output filter 208 may be implemented using a ceramic filter, surface acoustic wave (SAW) filter, or other filter structure, such that input impedance at the in-band frequency of the filter is lower than the input impedance at out of band frequencies. In some embodiments, output filter 208 provides an open circuit for modulation sidebands of the PWM signal. Parallel resonant tank 210 may also be coupled to the drain of transistor 204 to provide a short circuit for the higher order harmonics of the carrier signal and an open circuit for the carrier as well as modulation sidebands of the PWM signal.

In some embodiments, the out-of-band input impedance of filter 208 has a finite value and does not provide an ideal open circuit. Therefore, the PWM waveform is predistorted before being introduced to the gate of transistor 204. In embodiments, this predistortion shapes the signal such that a PWM modulated voltage waveform is present at the drain of transistor 204. In an embodiment, this predistortion may be performed by bandpass filter 212. For the sake of simplicity of illustration, an input matching network for the transistor 204 is not shown; however, in some embodiments, a matching network may be present, and/or matching considerations may be taken into account in the design of filter 212.

In an embodiment, the transfer function (magnitude and phase) of bandpass filter 212 for the carrier and the (limited) modulation sidebands is calculated as follows $$S_{21}(\omega) = \frac{X_t(\omega_c)}{X_t(\omega)},$$

where $X_t(\omega_c)$ denotes the complex load impedance at the intrinsic transistor for the carrier frequency $\omega_c$, and $X_t(\omega)$ is the complex impedance with respect to frequency. Thus high output impedance in the modulation sidebands corresponds to a high attenuation for the modulation sidebands of the current.

Figure 2B:
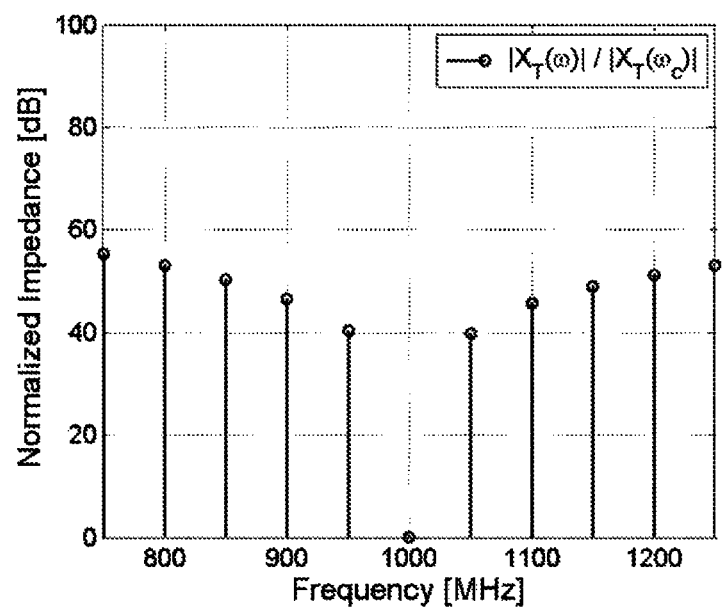
Figure 2C:
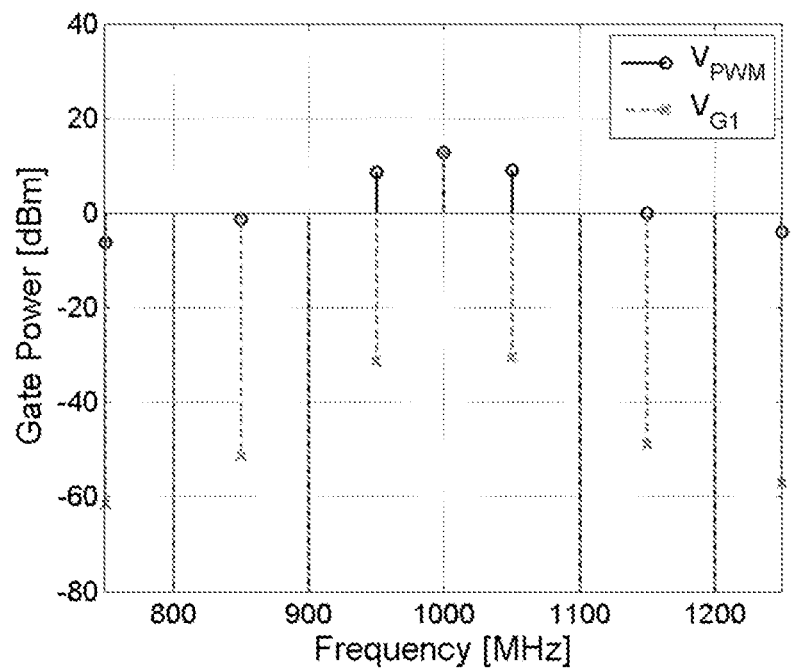
Figure 2D:
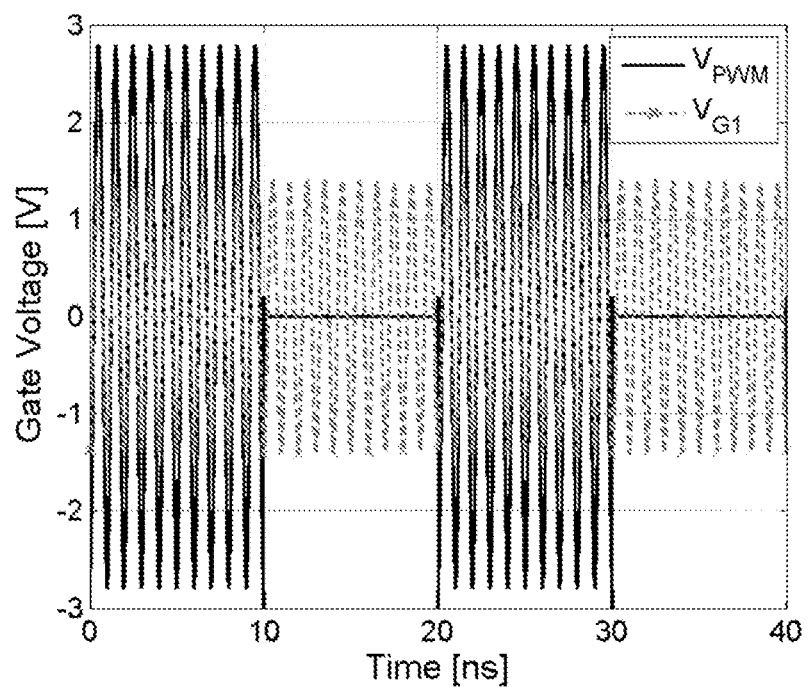

FIG. 2b illustrates a plot of normalized impedance with respect to frequency for sidebands of a 50 MHz PWM signal. It can be seen that the carrier frequency at 1000 MHz has a normalized impedance of 0 dB, while the sidebands have a normalized impedance of 40 dB or greater. Hence, the gate signal provided to transistor 204 is predistorted by the inverse of the normalized load impedance. FIG. 2c illustrates the corresponding spectra for the PWM signal $V_{PWM}$ and the gate voltage $V_{G1}$ and FIG. 2d illustrates a corresponding waveform diagram showing voltages $V_{PWM}$ and $V_{G1}$ with respect to time. It can be seen that the power in the modulation sidebands for the predistorted signal is significant lower than for the ideal PWM modulated signal. In the time domain, however, the predistorted signal looks very similar to a demodulated PWM signal in the time domain, since sidebands are still present at a defined amount. In some embodiments, the above transfer function may be calculated for the carrier frequency and a limited number of sidebands, for example, the first 5 sidebands. Alternatively, greater or fewer sidebands may be calculated.

In embodiments, predistortion may be accomplished either at RF frequencies, or at baseband frequencies using analog and/or digital signal processing. In some embodiments, the out of band impedance of filter 208 does not exceed an upper limit, in order to prevent large voltage swings that may result from the amplification of noise and distortion that may interfere with the in-band signal.

Figure 2E:
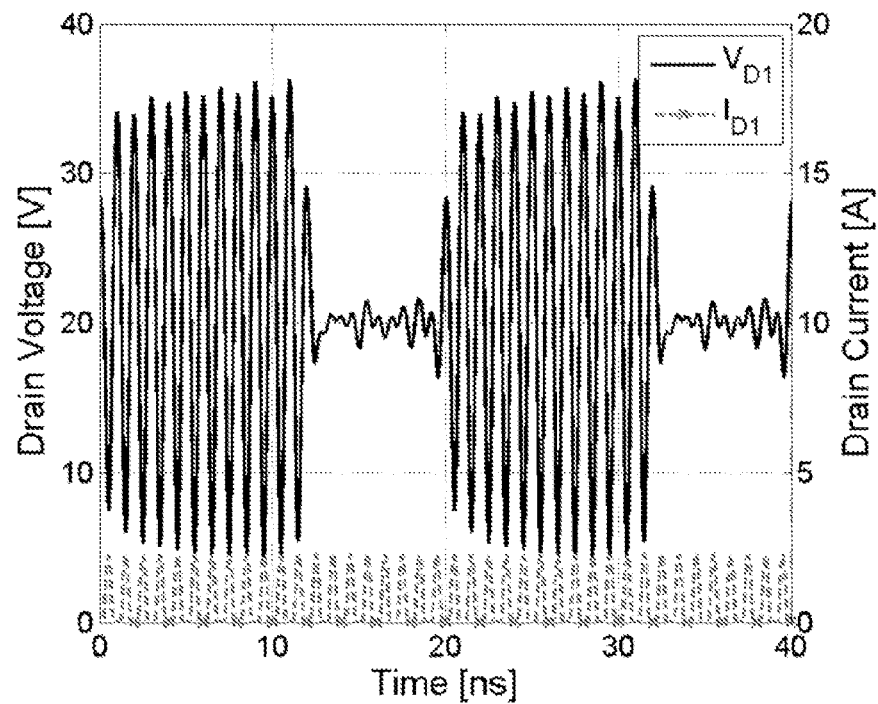
Figure 2F:
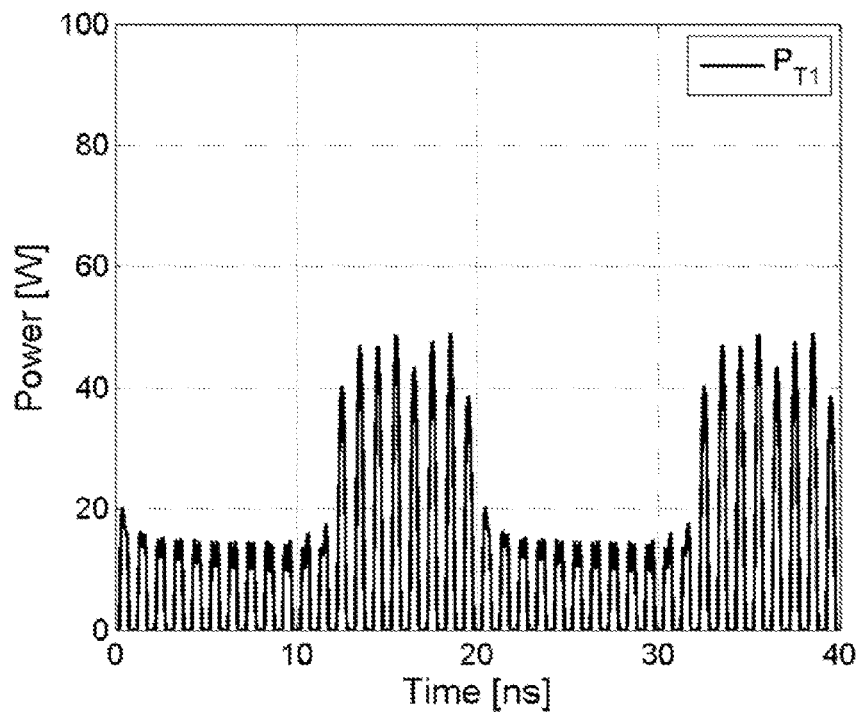

The resulting voltage and current waveforms at the drain of the transistor 204 are plotted in FIG. 2e, and the resulting power loss though transistor 204 is plotted in FIG. 2f. It can be seen that voltage $V_{D1}$ at the drain of transistor 204 is close to the intended PWM signal. It can also be observed that due to the PWM modulated envelope, the predistorted current has a more or less constant envelope, which causes a larger power loss during the PWM off period, where the supply voltage is present at the drain of transistor 204, which can be seen in FIG. 2f.

Figure 2G:
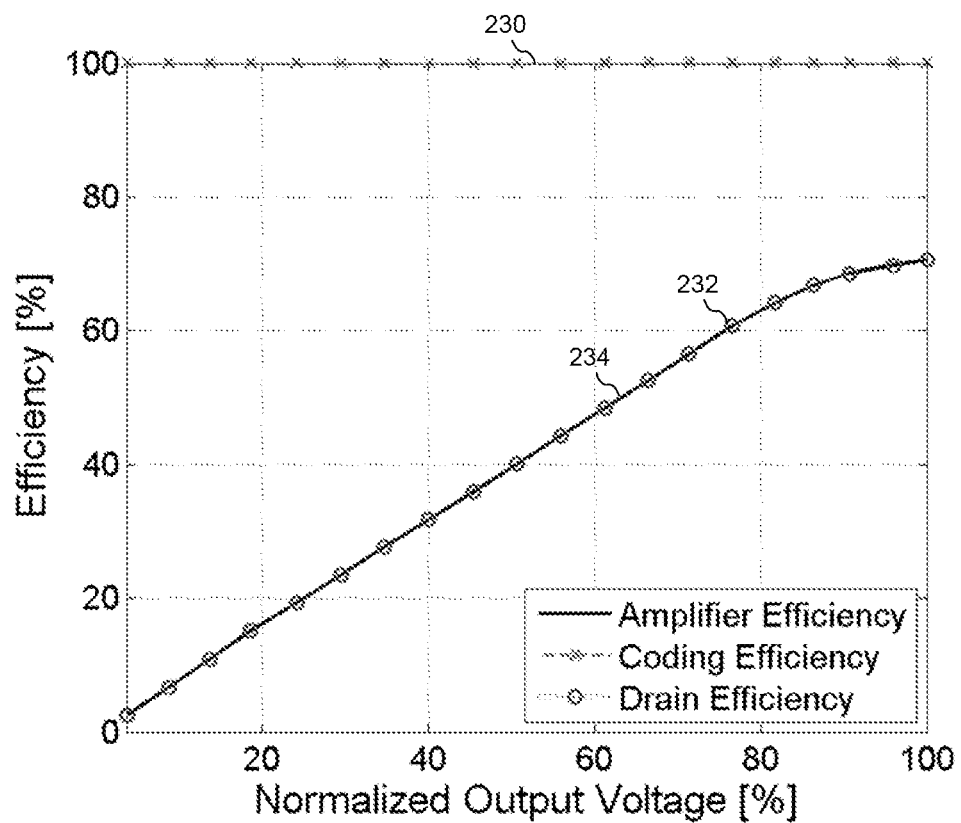

FIG. 2g illustrates an efficiency plot of system 200. As shown, coding efficiency 230 is almost 100% since the modulation sidebands see an open and thus no energy or very little energy is lost. Curves 232 and 234 show the drain efficiency and the resultant amplifier efficiency, respectively. Here, one limiting factor for the efficiency is the constant supply voltage during the RF off period, which results in a drain efficiency increasing linearly with the duty cycle, thereby limiting the efficiency of the amplifier.

Figure 3A:
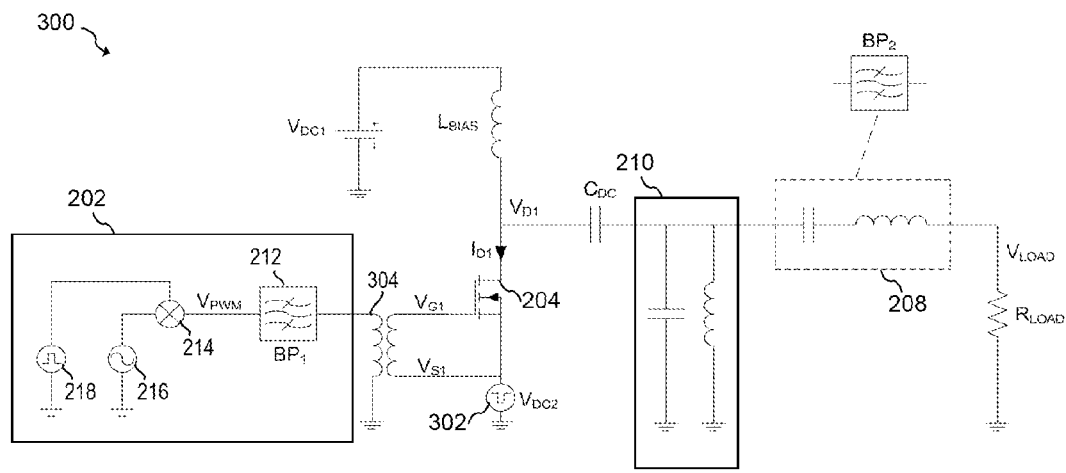
FIGS. 3a-g illustrate a power amplifier and associated performance graphs according to another embodiment.

FIG. 3a illustrates embodiment system 300 in which the source voltage of transistor 204 is modulated according to the duty cycle of PWM generator 202. As shown, the output of PWM generator 202 is coupled to gate node $V_{G1}$ via transformer 304. Furthermore, the source voltage of transistor 204 is modulated with voltage source 302 according to PWM signal $V_{PWM}$. In an embodiment, during the RF on period, the source voltage transistor 204 is kept at 0V to enable conventional operation of the amplifier. However, during the RF off period, the source potential of transistor 204 is set to a higher voltage, for example, below the supply voltage, in order to minimize the voltage drop and thus the losses in the transistor during that time.

In one example, a supply voltage of 20V ($V_{DC2}$) and a 15V peak for the source modulation ($V_{DC1}$) may be used. This results in effective operating voltages of 5V and 20V for transistor 204. For output voltage swings below 5V, the source potential of transistor 204 is kept constant for normal class B operation in some embodiments. Alternatively, other supply voltages, effective operating voltages, and class B operation thresholds may be used.

Figure 3B:
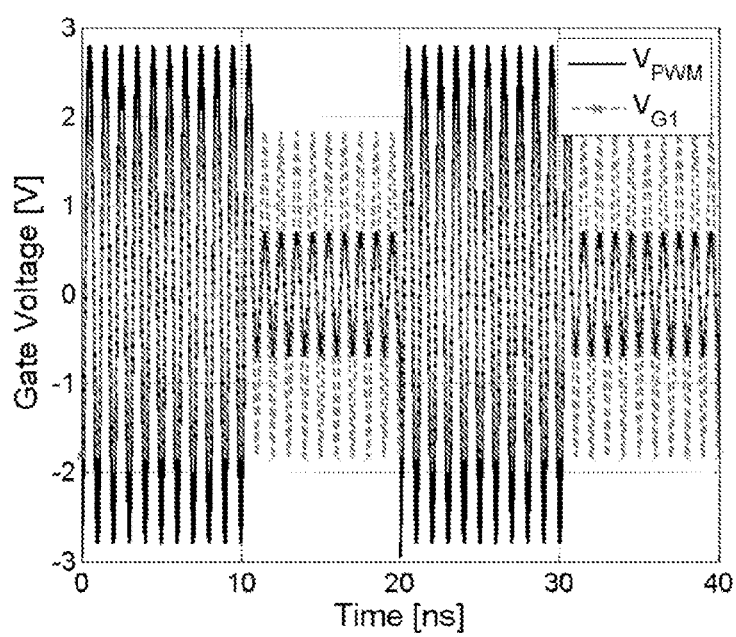
Figure 3C:
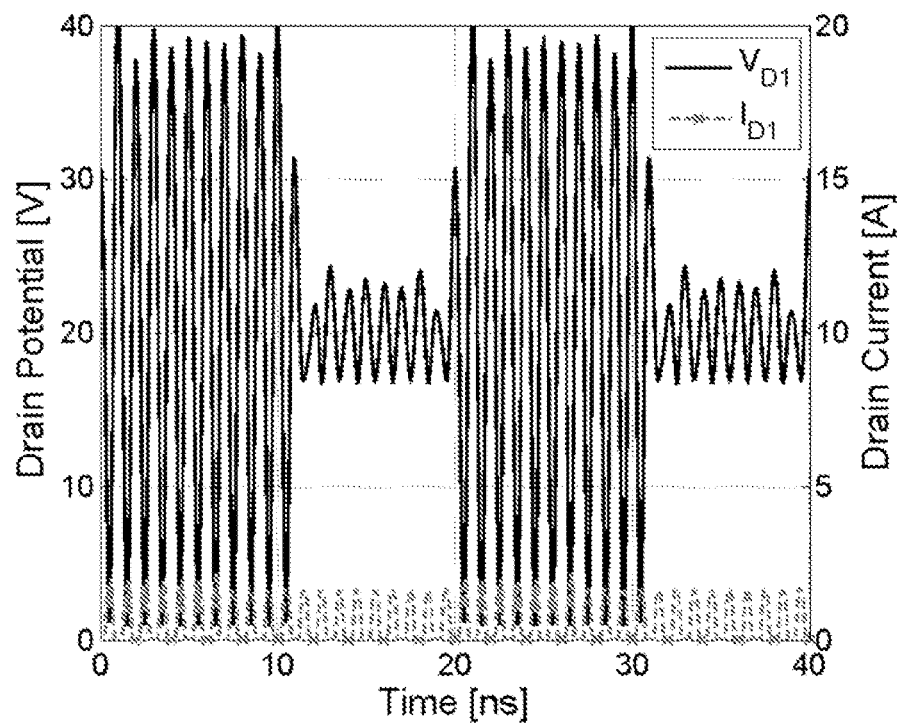
Figure 3D:
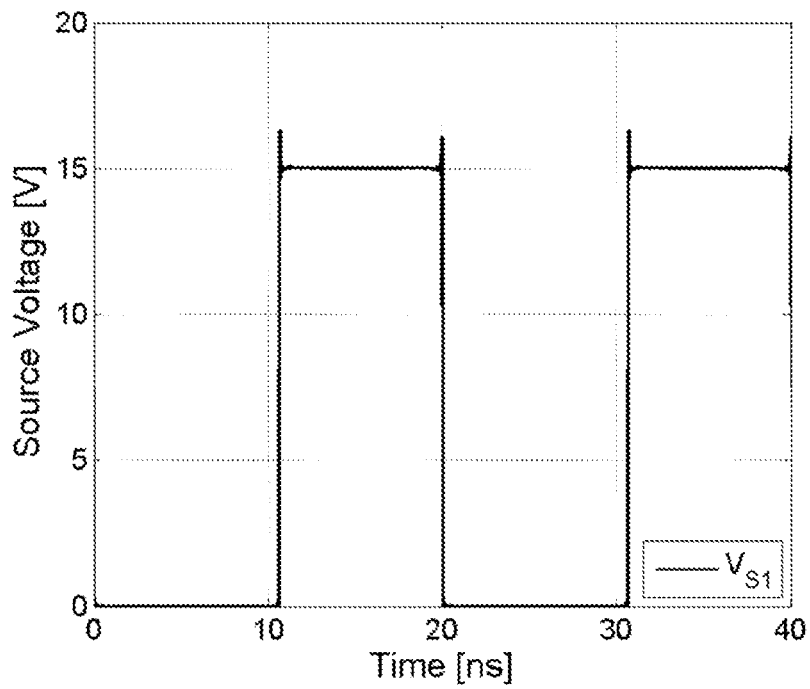
Figure 3E:
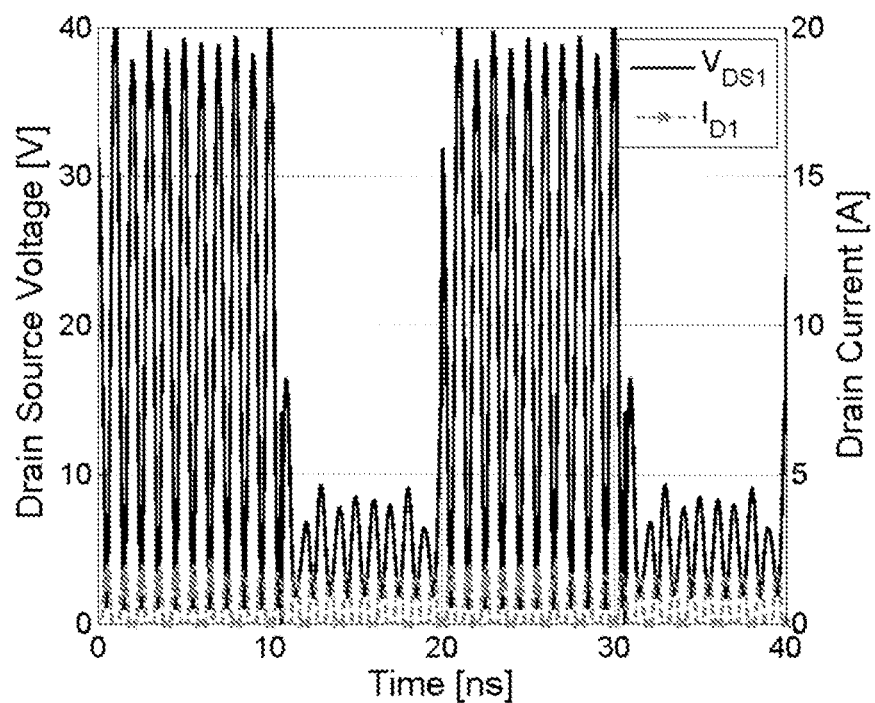
Figure 3F:
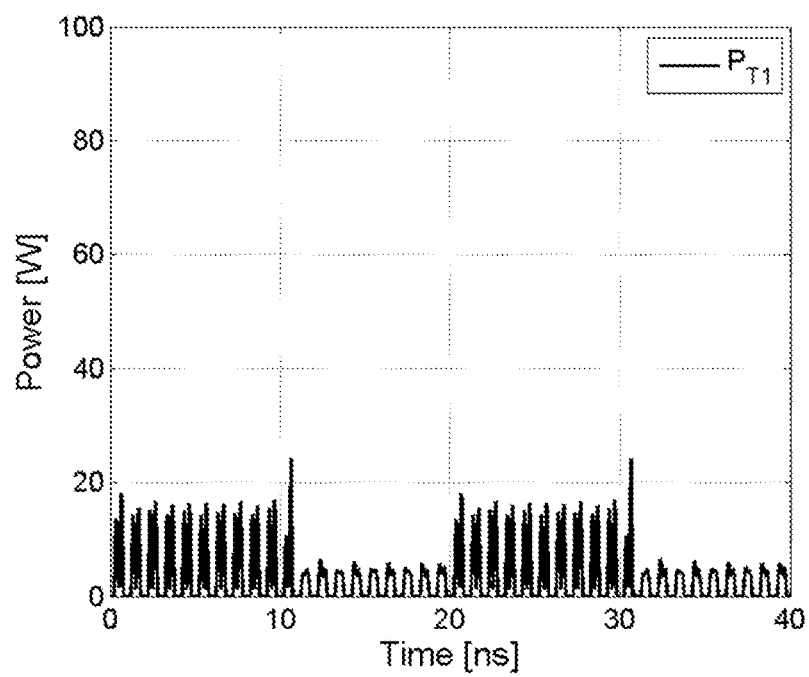

Time domain waveforms corresponding to the above example relating to system 300 are illustrated in FIGS. 3b-f. FIG. 3b illustrates $V_{PWM}$ and gate voltage $V_{G1}$ of transistor 204; FIG. 3c illustrates drain voltage $V_{D1}$ and drain current $I_{D1}$ of transistor 204; FIG. 3d illustrates the source voltage of transistor 204; FIG. 3e illustrates drain-source voltage $V_{DS1}$ and drain current $I_{D1}$ of transistor 204; and FIG. 3f illustrates the power loss through transistor 204. It can be seen in FIG. 3f that the power loss though transistor 204 are much smaller during the off-period of the PWM signal than during the on-period.

Figure 3G:
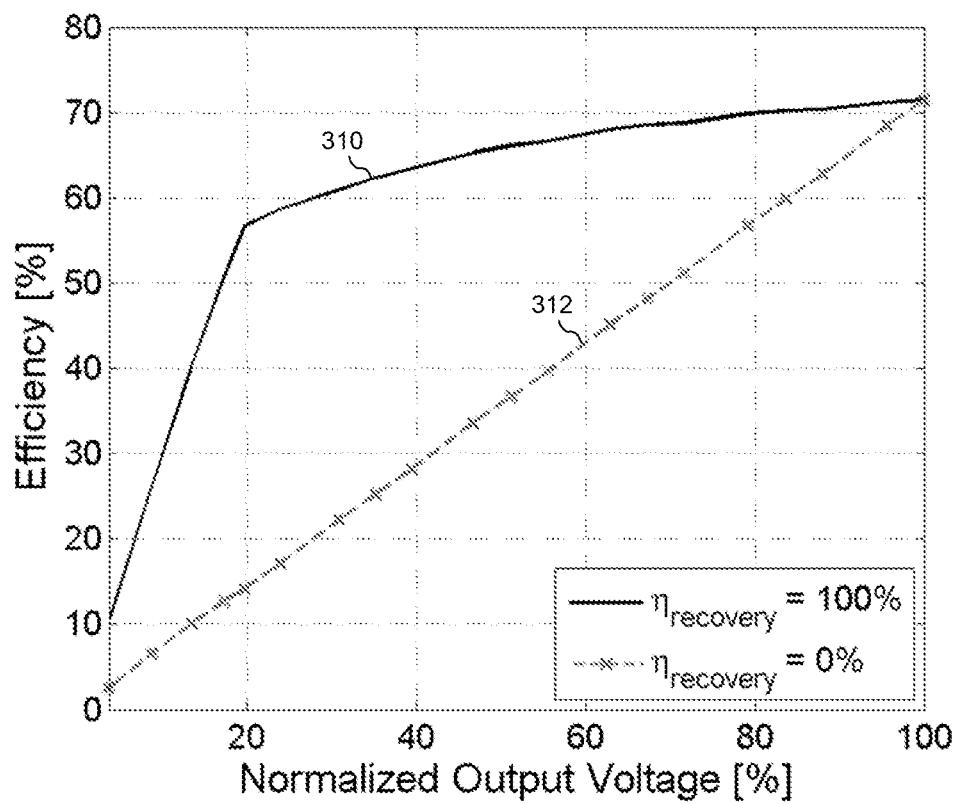

FIG. 3g illustrates the corresponding efficiency curves. Curve 310 represents the case in which the source voltage of transistor 204 is modulated, and curve 312 represents the case in which the source of transistor 204 is not modulated and is kept at ground potential. When the source voltage of transistor 204 is modulated, it may be considered that energy is recovered ($\eta_{recovery}$=100%) and the efficiency is improved. If the source voltage is not modulated, no energy recovery ($\eta_{recovery}$=0%) is performed, so the efficiency curve is similar to that of a class B amplifier. In some embodiments, normal class B operation is performed at normalized output voltages below 20%. For low duty cyles of the PWM signal, limited steepness of the edges due to the inherent band limitation of the system and the losses in the transistor during the RF off period due to the knee voltage may limit the efficiency of the system.

Figure 4A:
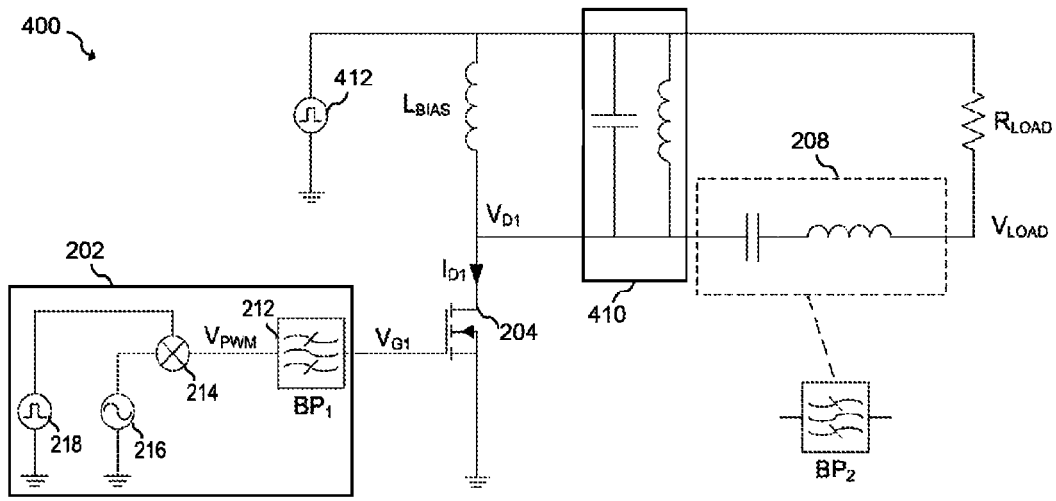
FIGS. 4a-e illustrate a power amplifier and associated performance graphs according to a further embodiment.

FIG. 4a illustrates embodiment system 400 in which supply 412 is coupled to the drain of transistor 204 via bias inductor $L_{BIAS}$ is high during an RF on-period and low during an RF off-period. As such, a low voltage drop is achieved at the drain of transistor 204 during the RF off-period, thereby increasing the efficiency of system 400. In some embodiments, a load may be coupled to node $V_{LOAD}$ via a transformer in order to achieve a ground referenced output signal. LC tank 410 may be coupled between the output of supply 412 and the drain of transistor 204 to provide a short circuit for the harmonics of the carrier and an open circuit for the carrier and the modulation sidebands. In some cases, system 400 may be viewed as performing "discrete PWM envelope tracking" with two distinct voltage levels for the supply.

Figure 4B:
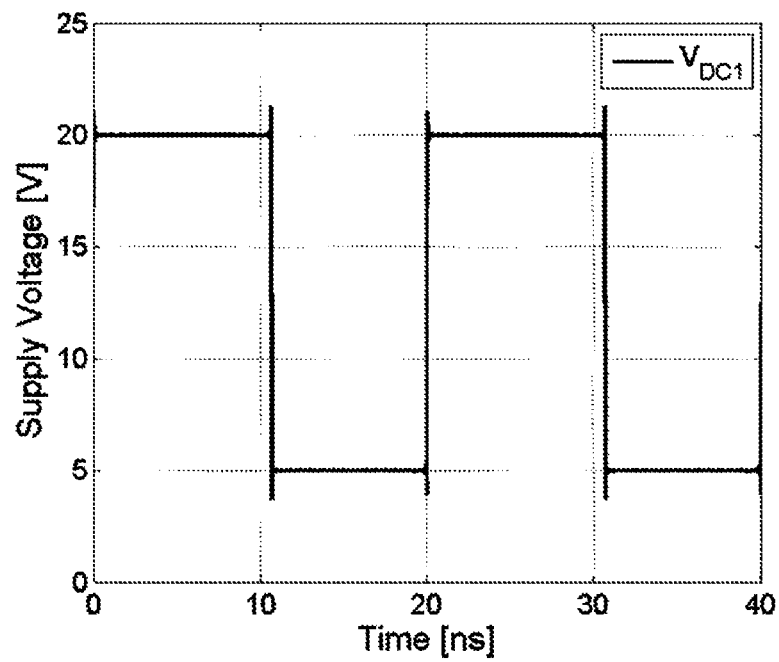
Figure 4C:
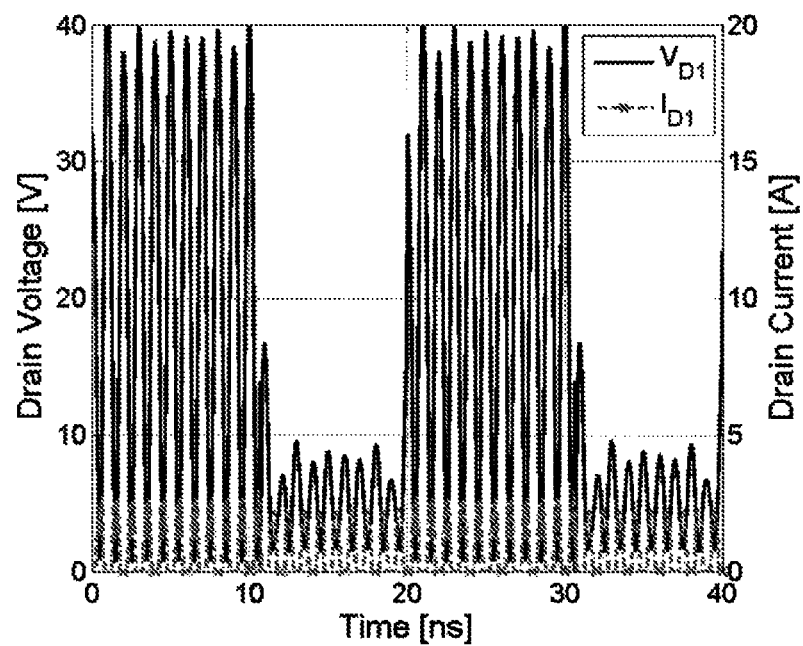
Figure 4D:
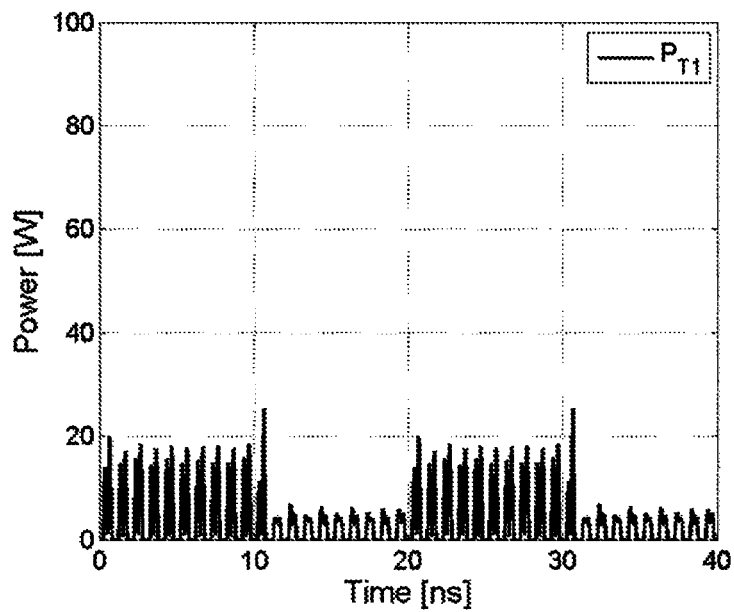
Figure 4E:
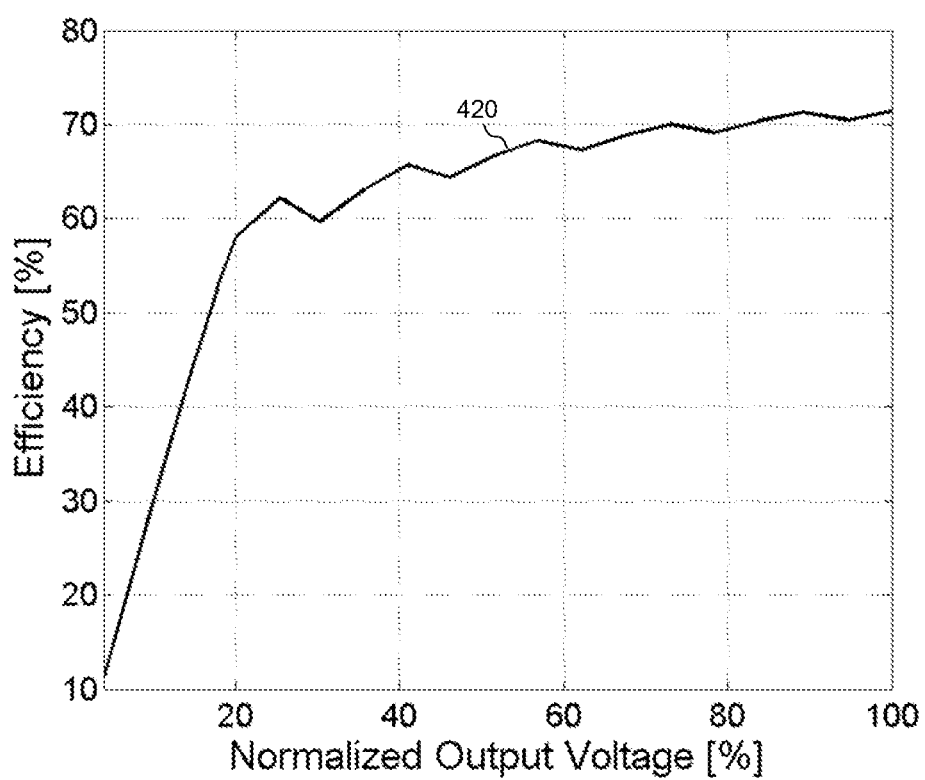

FIGS. 4b-d illustrate time domain waveforms associated with the operation of system 400. FIG. 4b illustrates a waveform of power supply voltage of supply 412; FIG. 4c illustrates waveforms of drain voltage $V_{D1}$ and drain current $I_{D1}$ of transistor 204; and FIG. 4d illustrates power loss $P_{T1}$ of transistor 204. It can be seen, that when supply voltage 412 is high, normal operation ensues, and when supply voltage 412 is low, power dissipation $P_{T1}$ is significantly reduced. As such, transistor 204 may conduct current for the lower drain-source voltage, while maintaining a high efficiency, as shown by efficiency curve 420 in FIG. 4e, which represents the efficiency of one example of the operation of system 400.

Figure 5A:
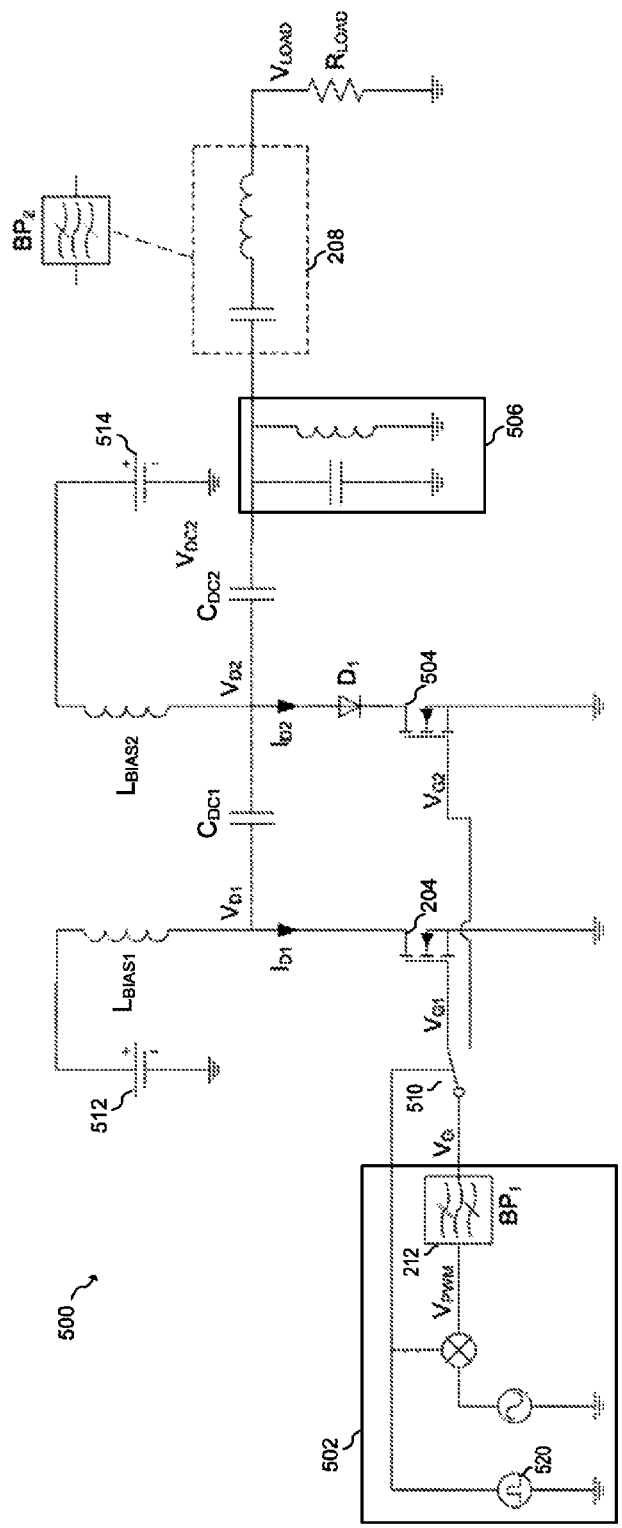
FIGS. 5a-h illustrate a power amplifier and associated performance graphs according to another further embodiment.

FIG. 5a illustrates further embodiment system 500 having two input stages: a first stage having transistor 204 powered by DC supply 512 and biased by inductor $L_{BIAS1}$, and a second stage having transistor 504 powered by DC supply 514 and biased by inductor $L_{BIAS2}$. The drain of transistor 204 is coupled to the drain of transistor 504 via coupling capacitor $C_{DC1}$, and the drain of transistor 504 is coupled to parallel LC tank 506 and output filter 208 via coupling capacitor $C_{DC2}$. A load is represented by resistor $R_{LOAD}$. In some embodiments, diode D1 is coupled between bias inductor $L_{BIAS2}$ to protect the drain of transistor 504 from negative voltages with respect to the bulk of transistor 504 during operation. In embodiments in which transistors 204 and 504 are implemented using LDMOS device, diode D1 may prevent the forward biasing of the body diode of the LDMOS device.

In an embodiment, filtered PWM signal $V_G$ is multiplexed between the gate of transistor 204 and the gate of transistor 504 during operation of system 500 according to the PWM modulation. This multiplexing is represented by switch 510 coupled between PWM generator and transistor 204 and 504 that is controlled by PWM generator 520. For example, during the RF on-period, signal $V_G$ is coupled to the gate of transistor 204. During the RF off-period, signal $V_G$ is coupled to the gate of transistor 504.

In an embodiment, supply voltage 512 delivered to the first stage is about 20V, and is higher than supply voltage 514 delivered to the second stage, which is about 5V. Here, the 20V output of supply 512 provides most of the output power of system 400. The 5V output of supply 514 provides power for the low power regime during the RF off-period, and enables constant current conduction during this RF off-period.

Figure 5B:
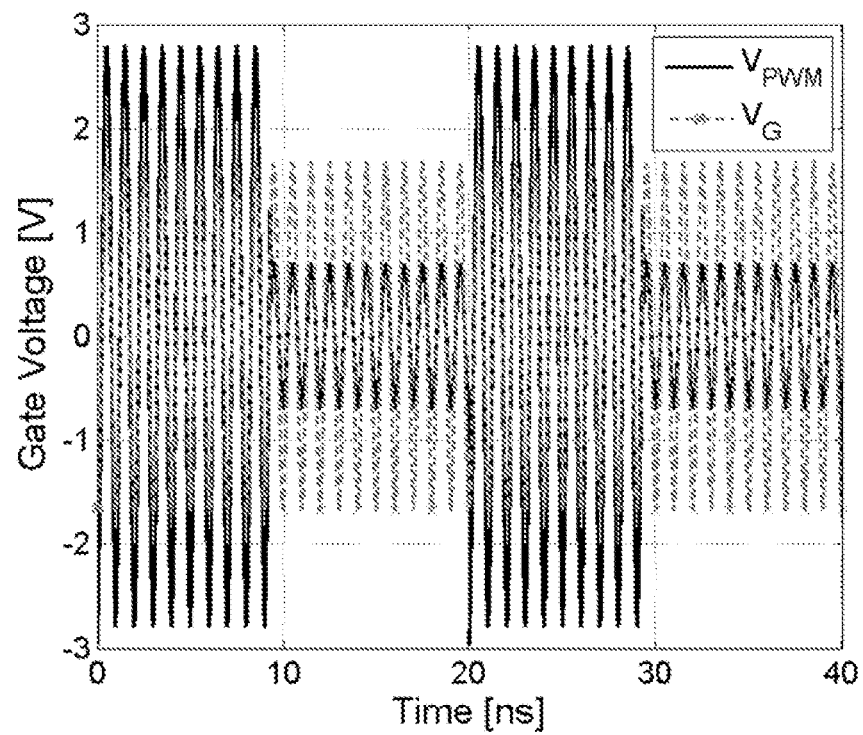
Figure 5C:
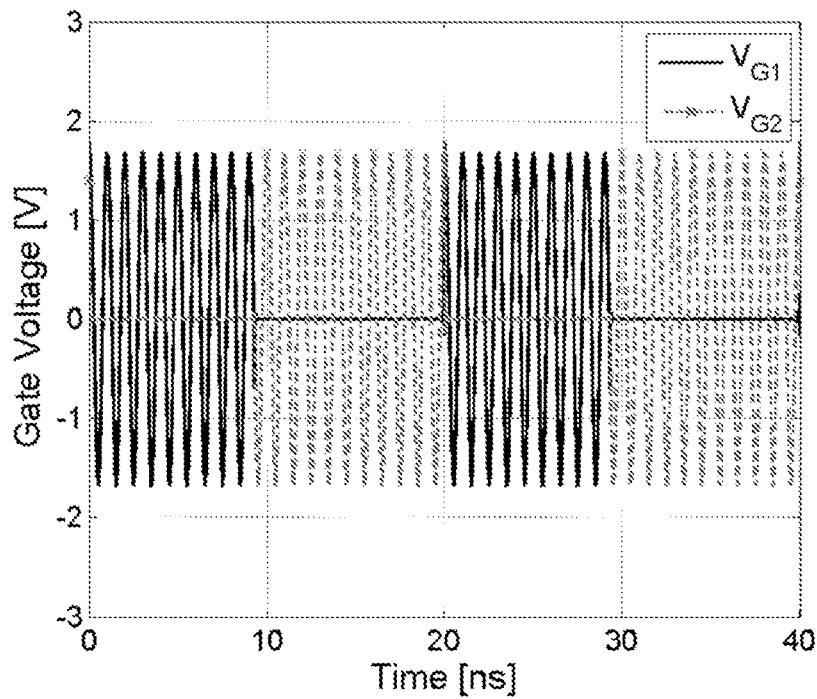
Figure 5D:
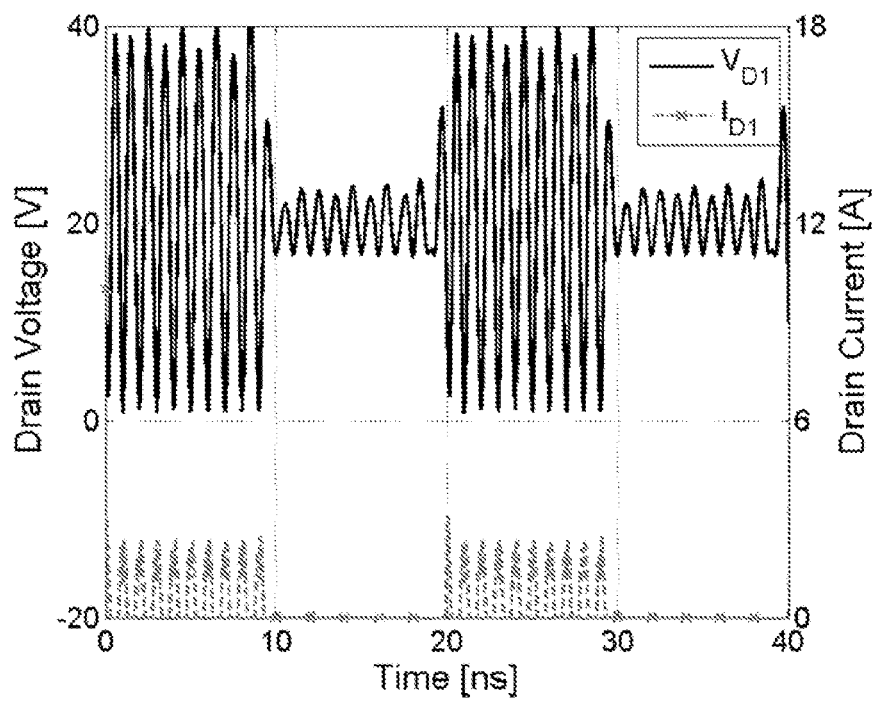
Figure 5E:
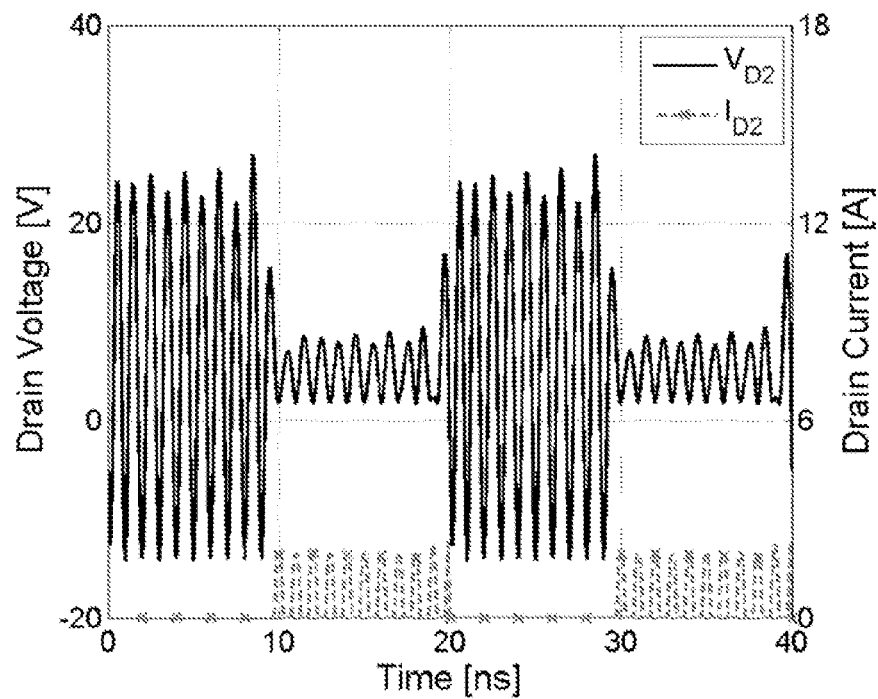
Figure 5F:
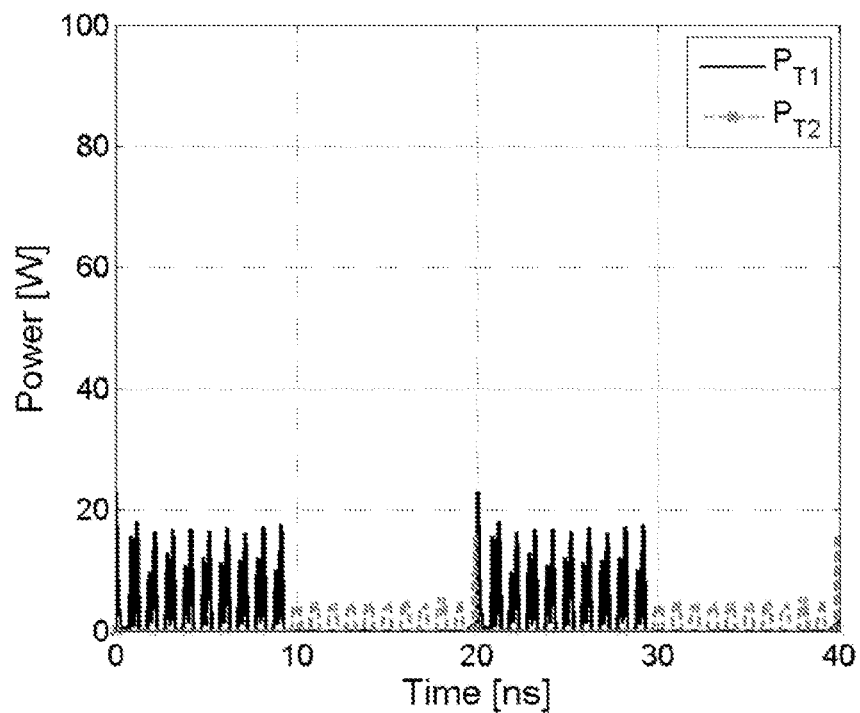

FIGS. 5b-f illustrate time domain waveforms associated with the operation of system 500. FIG. 5b illustrates $V_{PWM}$ and $V_G$ generated by PWM generator 502; FIG. 5c illustrates the gate voltages $V_{G1}$ and $V_{G2}$ of transistors 204 and 504, respectively; FIG. 5d illustrates drain voltage $V_{D1}$ and drain current $I_{D1}$ of transistor 204; FIG. 5e illustrates drain voltage $V_{D2}$ and drain current $I_{D2}$ of transistor 504; and FIG. 5f illustrates power loss $P_{T1}$ of transistor 204 and $P_{T2}$ of transistor 504.

Figure 5G:
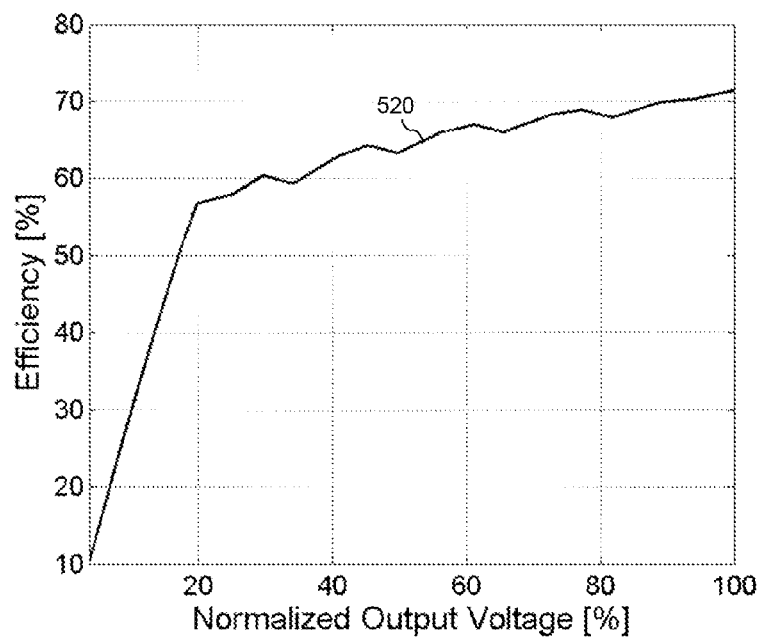

During the RF on-period, transistor 204 is active with a large voltage swing at its drain, as shown by FIG. 5d. However, during the RF off-period, no power, or a small amount of power is consumed by transistor 204. As is further shown in FIG. 5e, transistor 504 is active during the RF off-period. However, there are fewer losses during the RF off-period because supply voltage 514 applied to transistor 504 is lower than supply voltage 512 applied to transistor 514, as shown in FIG. 5f. FIG. 5g illustrates the efficiency of an example embodiment system 500 with respect to normalized output voltage.

Figure 5H:
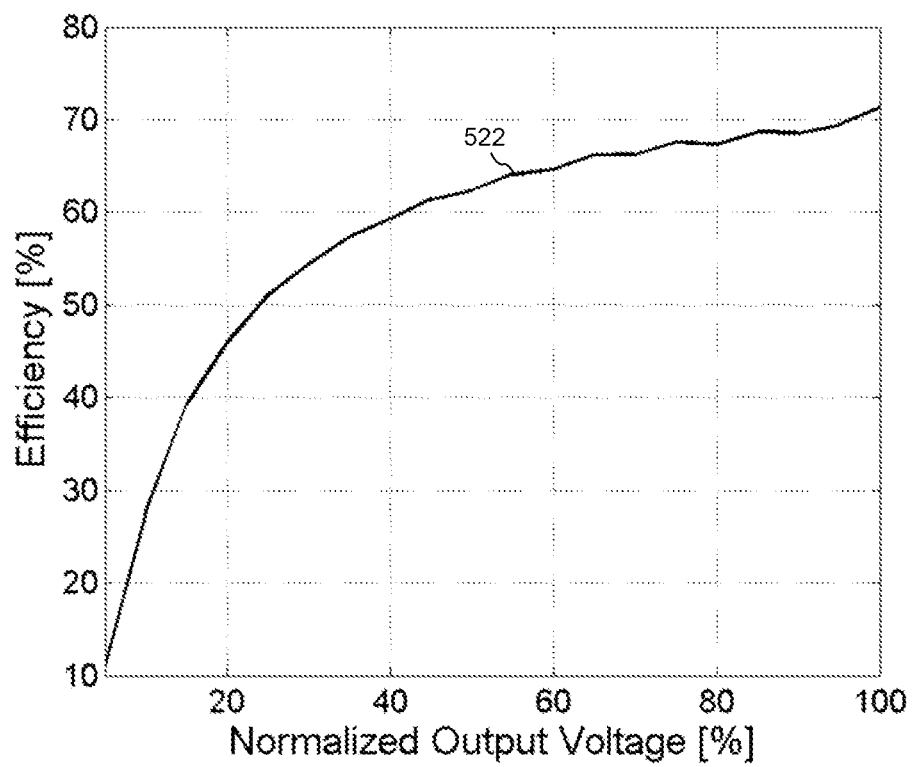

In some embodiments, during the RF off-period, transistors may be biased slightly above the knee voltage in order to "emulate" the operation of a switch with class B operation. For example, in some embodiments, transistor 504 may be biased at about 2 V. A corresponding efficiency curve 522 is illustrated in FIG. 5h. Some embodiments may incorporate concepts, systems and methods described in U.S. Pat. No. 7,679,434 patented on Mar. 3, 2010 entitled "Amplifier modulation method and apparatus," which application is incorporated by reference herein in its entirety.

It should be appreciated the examples of a 20 V power supply and a 5 V power supply, are only specific illustrative examples. In alternative embodiments, other supply voltage values may be used. For example, in some embodiments, supply voltages with a ratio of 1/2 or other ratio may be selected. FIG. 6a-e illustrate waveform diagrams corresponding to system 500 having supply 512 set to 20 V and supply 514 set to 10 V. In addition, PWM generator and system 500 is configured to deliver a PWM having an average PWM output level of 75%, where half of the time, system 500 outputs a full level signal and the other half of the time, system 500 outputs a 50% output level. In an embodiment, for output voltages with a maximum voltage swing below 10V, only transistor 504 with the smaller supply voltage is used. For output voltages with a voltage swing above 10V a PWM modulated signal is used that switches between the two supply levels. Hence, the maximum output voltage of the transistor 504 is constantly present at the output and delivers a "DC part" of the modulated signal and the voltage difference between transistor 204 and transistor 504 PWM modulated.

Figure 6A:
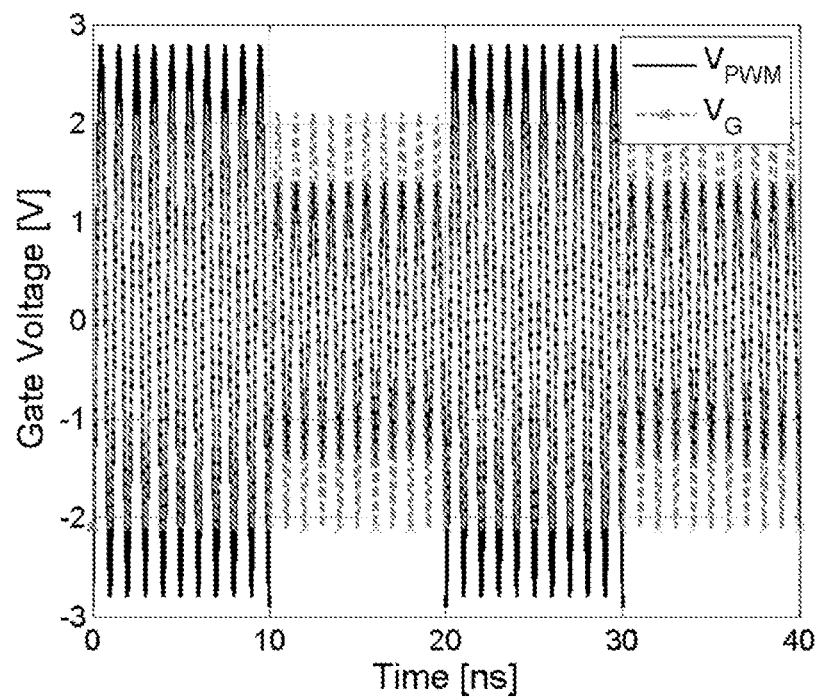
Figure 6B:
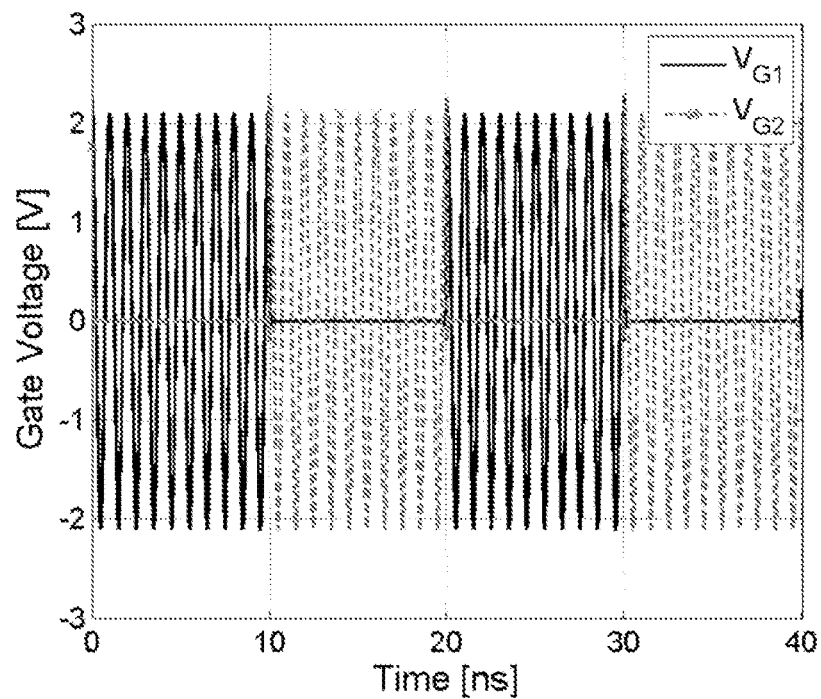
Figure 6C:
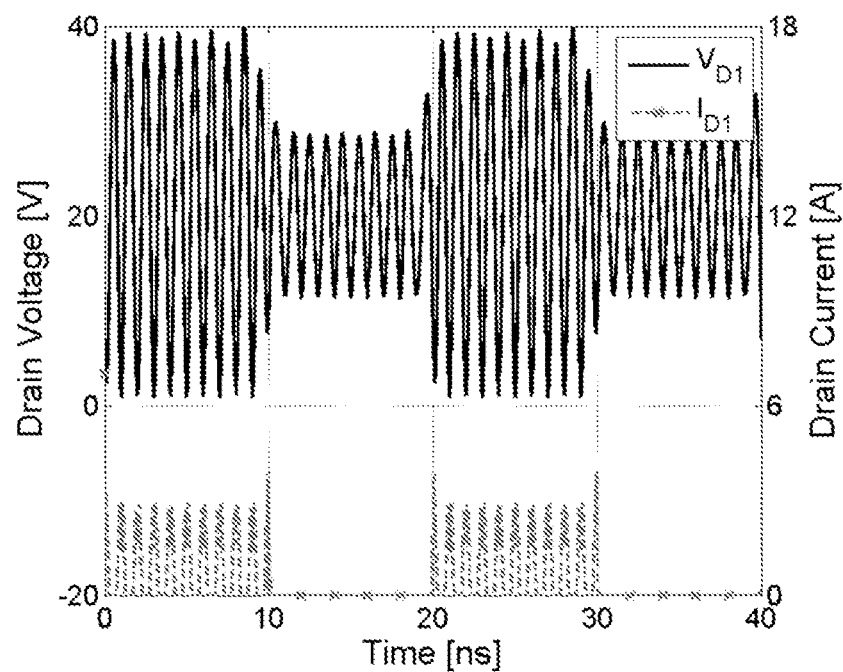
Figure 6D:
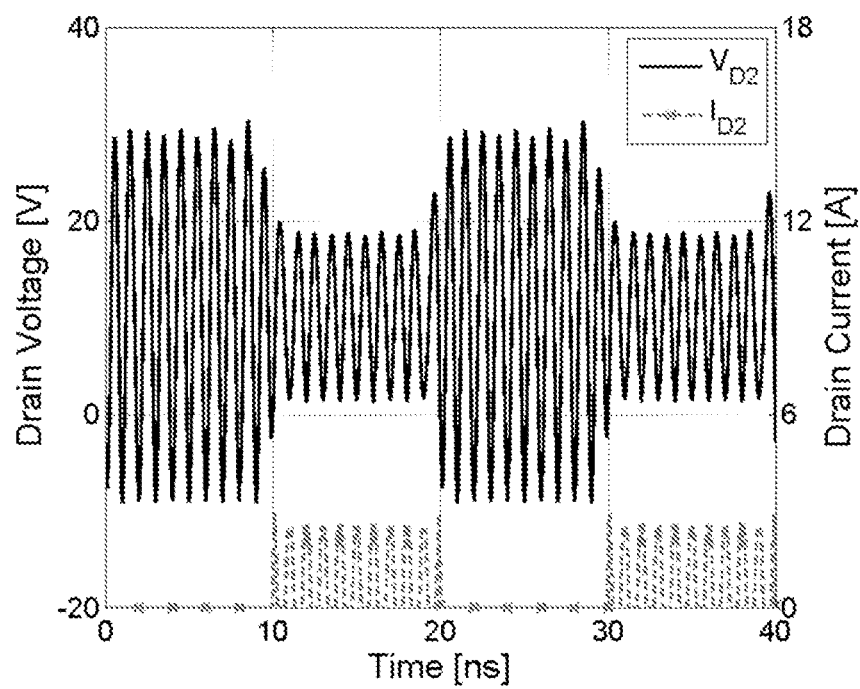
Figure 6E:
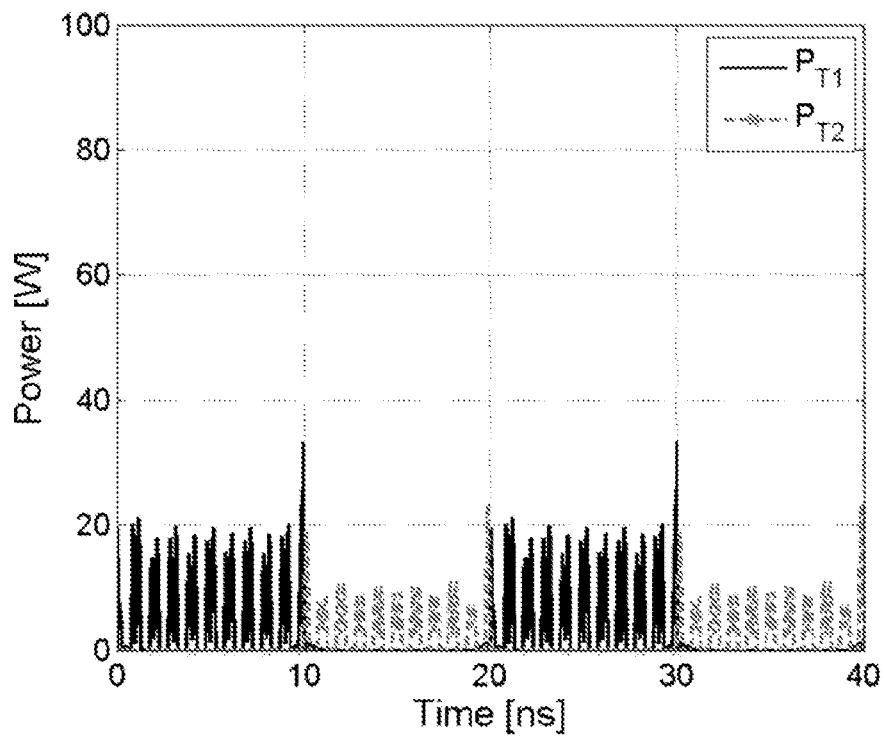

FIGS. 6a and 6b illustrate multiplexed predistorted signals for an embodiment having 50% duty cycle and a 75% output voltage. FIG. 6a illustrates $V_{PWM}$ and $V_G$ of PWM generator 502, and FIG. 6b illustrates gate drive signal $V_{G1}$ for transistor 204 and gate drive signal $V_{G2}$ for transistor 504. FIG. 6c illustrates drain voltage $V_{D1}$ and drain current $I_{D1}$ of transistor 204, FIG. 6d illustrates drain voltage $V_{D2}$ and drain current $I_{D2}$ of transistor 504, and FIG. 6e illustrates power consumption $P_{T1}$ of transistor 204 and $P_{T2}$ of transistor 504.

It can be seen that for the "RF on" period (meaning the higher output voltage swing in this case) transistor 204 is active with its maximum output voltage. During the "RF off" (meaning the lower output voltage swing) transistor 504 is active with its maximum output voltage swing and thus maximum efficiency. It can be further seen that the resulting output voltage envelope has a constant part (10V due to transistor 504) and an additional PWM modulated part (10V difference between transistor 204 and transistor 504). Accordingly, both transistor 204 and transistor 504 operate at a high efficiency point with low losses.

Figure 6F:
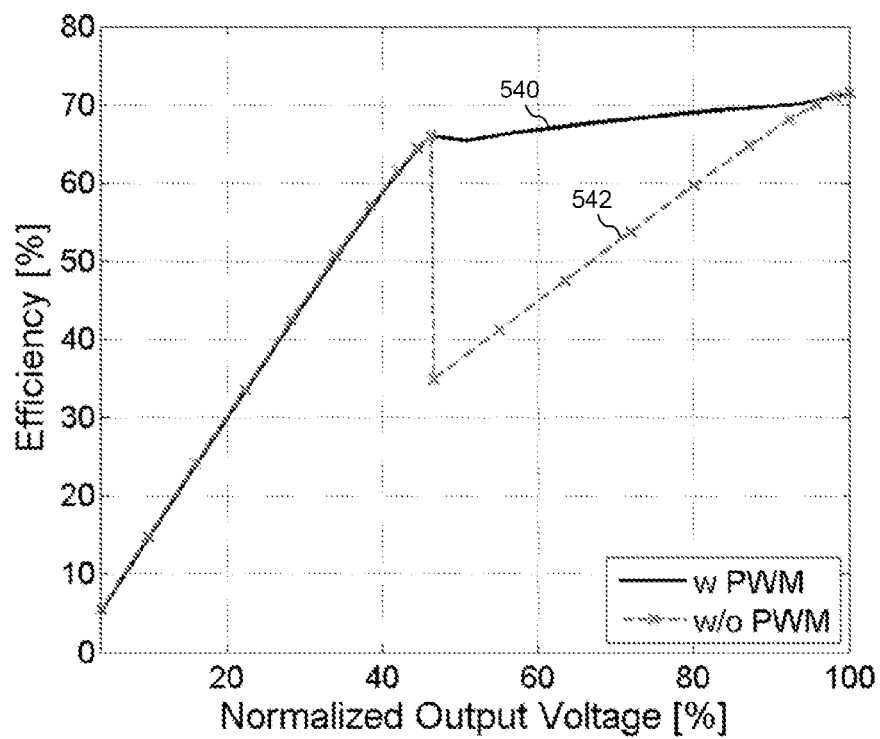

Resulting efficiency curves 540 and 542 are illustrated in FIG. 6f. For output voltages below 50%, only the transistor 504 is active and thus efficiency curves 540 are 542 reflect an efficiency similar to class B operation. For normalized output voltages above 50%, both transistors are active and operate at or near their most efficient points. Hence, the resulting efficiency curve connects in a first order approximation these two points. The efficiency curve 542 without PWM modulated signals shows a conventional "sawtooth" behavior for two different supply voltages, whereas efficiency curve 540 represents the efficiency of system 500 using PWM modulation. Thus, embodiments that use PWM signals together with a direct filter connection have an improved efficiency over a class B system between these two maxima.

Figure 7:
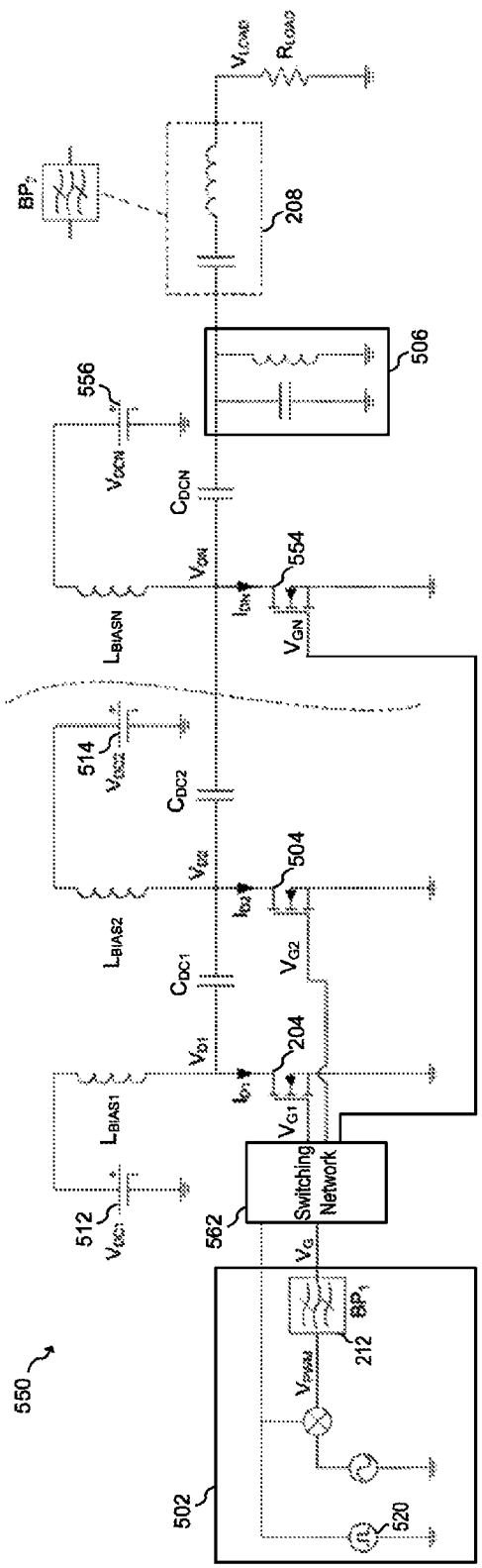
FIG. 7 illustrates an embodiment power amplifier having multiple stages.

FIG. 7 illustrates embodiment system 550 in which multiple parallel input stages are combined. In addition to the first and second input stages having transistors 204 and 504 described with respect to system 500, system 550 has one or more additional stages represented by transistor 554 powered by supply 556 via bias inductor $L_{BIASN}$. In an embodiment, switching network 562 routes output $V_G$ of PWM generator 502 to transistors 204, 504, 554 and other transistors, depending on the embodiment. Using embodiment system 550, a multi-level PWM signal may be generated using parallel stages. Some embodiments may incorporate concepts, systems and methods described in U.S. patent application Ser. No. 3/417,000 filed on Mar. 9, 2012 entitled "Pulse-Width Modulator and Methods of Implementing and Using the Same," which application is incorporated by reference herein in its entirety.

Figure 8A:
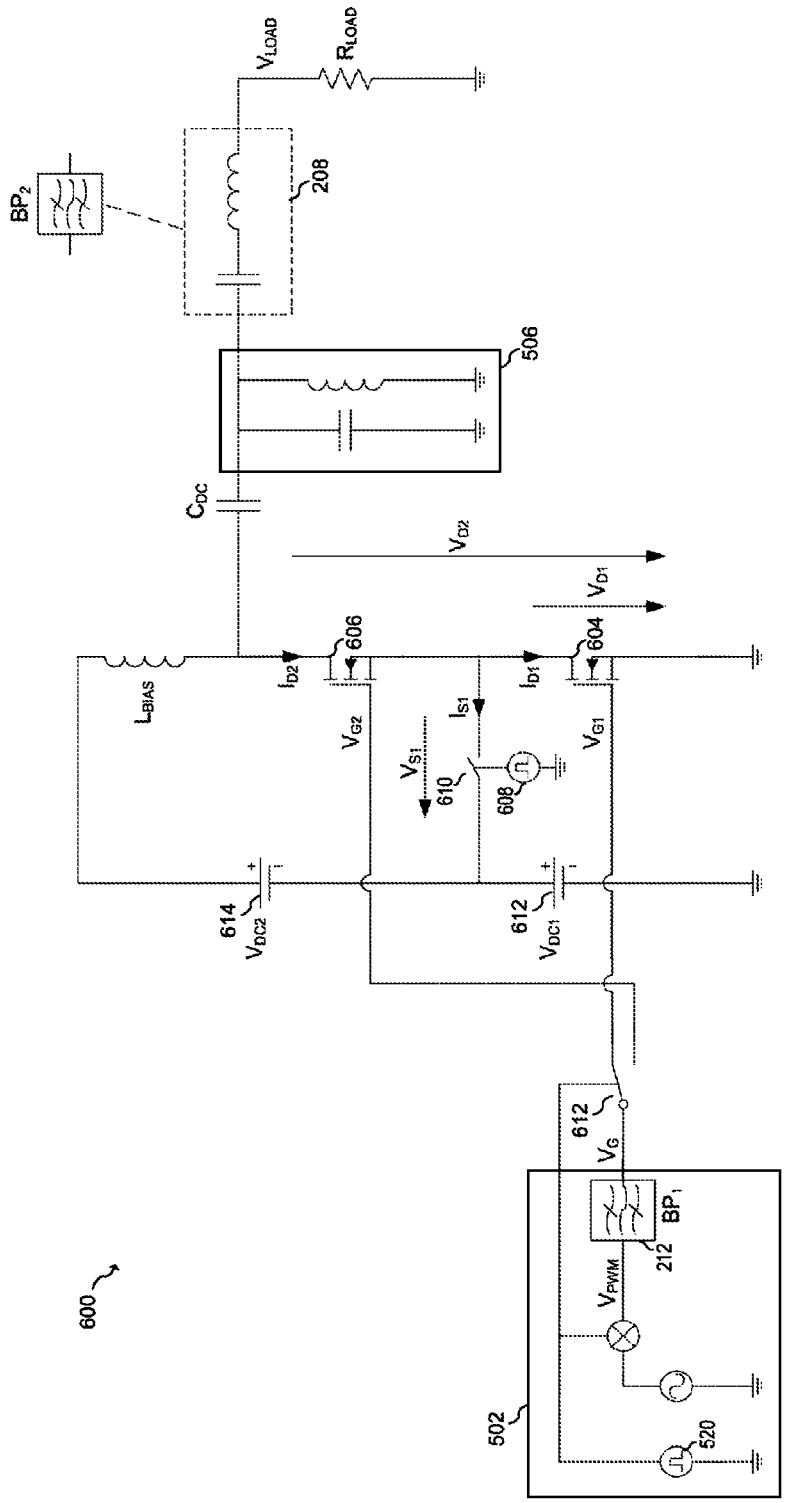
FIG. 8a-h illustrate an embodiment cascoded amplifier and associated performance graphs.
Figure 8B:
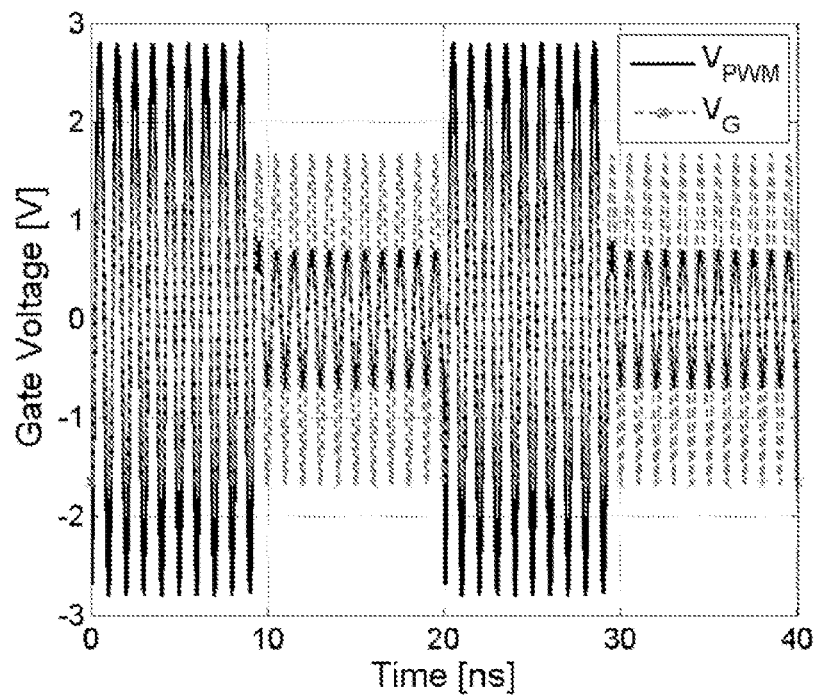
Figure 8C:
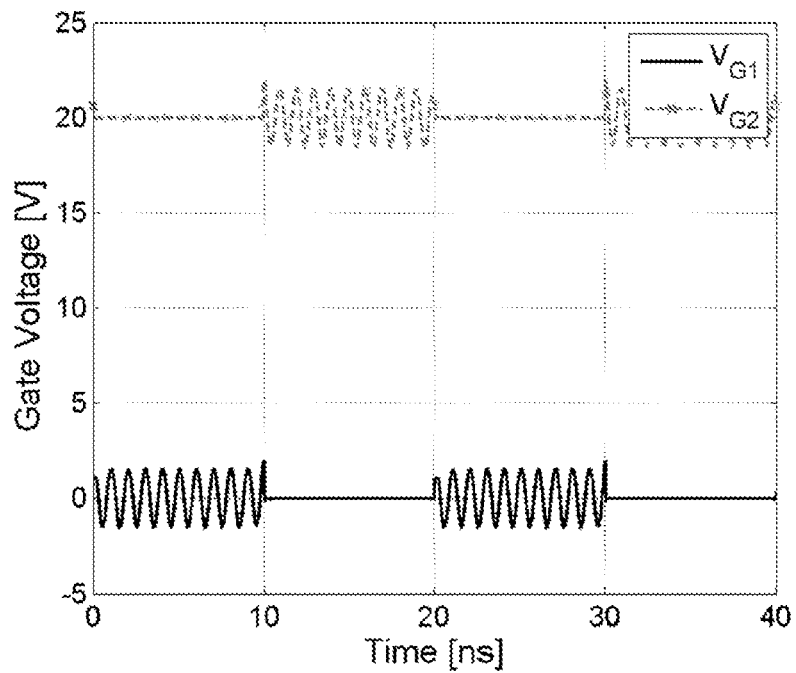

FIG. 8a illustrates embodiment system 600 in which predistorted output $V_G$ is multiplexed between transistor 604 and cascode transistor 606. Here, supply 612 is set to a first voltage, and supply 614 is set to a second voltage that allows for efficient operation. For example, in one embodiment, the first voltage may be about 20 V and the second may be about 5V. Alternatively, other voltages may be used. During the RF on-period, the upper transistor 606 is used in cascode configuration and has a fixed bias voltage, and switch 610, which is controlled by source 608, is open during that time. Circuit 600 in this state now operates as a conventional amplifier in cascode configuration. During the RF off-period, switch 610 is closed and transistor 604 is switched off. Predistorted gate signal $V_G$ is now applied to transistor 606, which operates on a lower supply voltage. In some embodiments, switch 610 is configured to conduct current in one direction and cope with negative voltage. FIGS. 8b-c illustrate waveform diagrams of multiplexed and biased gate signals for a duty cycle of 50%. FIG. 8b shows $V_{PWM}$ and $V_G$ generated by PWM generator 502, and FIG. 8c shows gate drive signals $V_{G1}$ of transistor 604 and $V_{G2}$ of transistor 606.

Figure 8D:
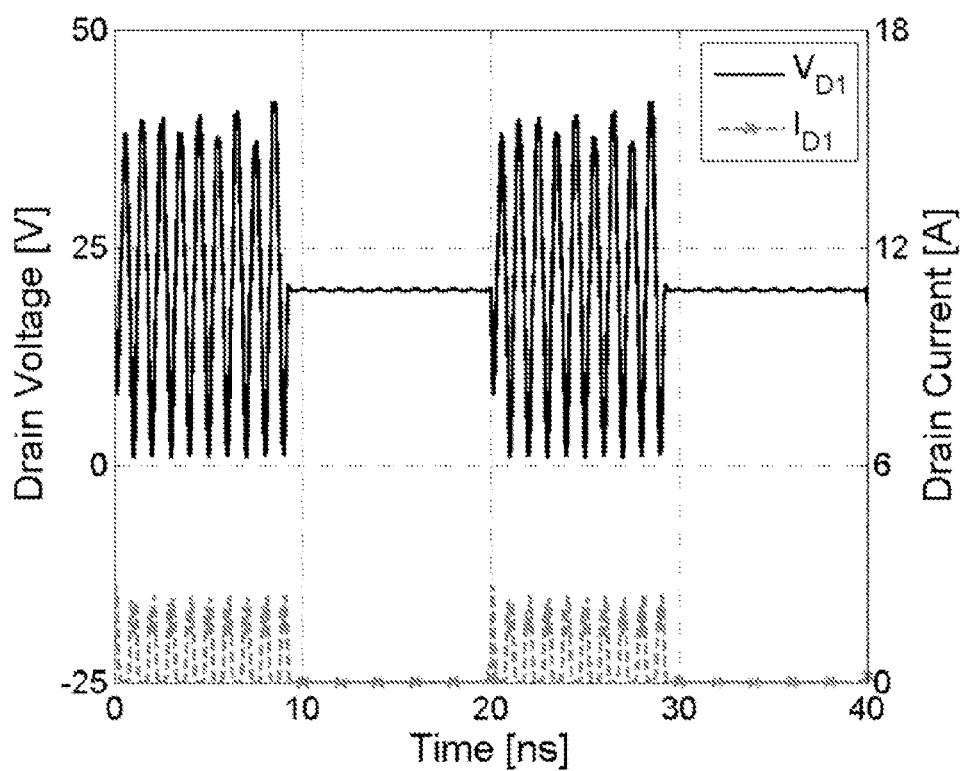
Figure 8E:
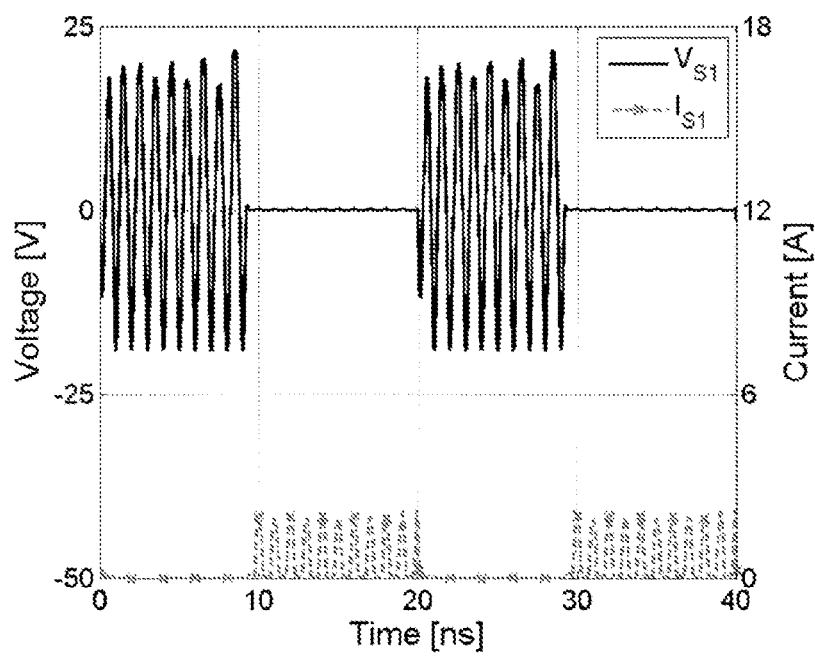
Figure 8F:
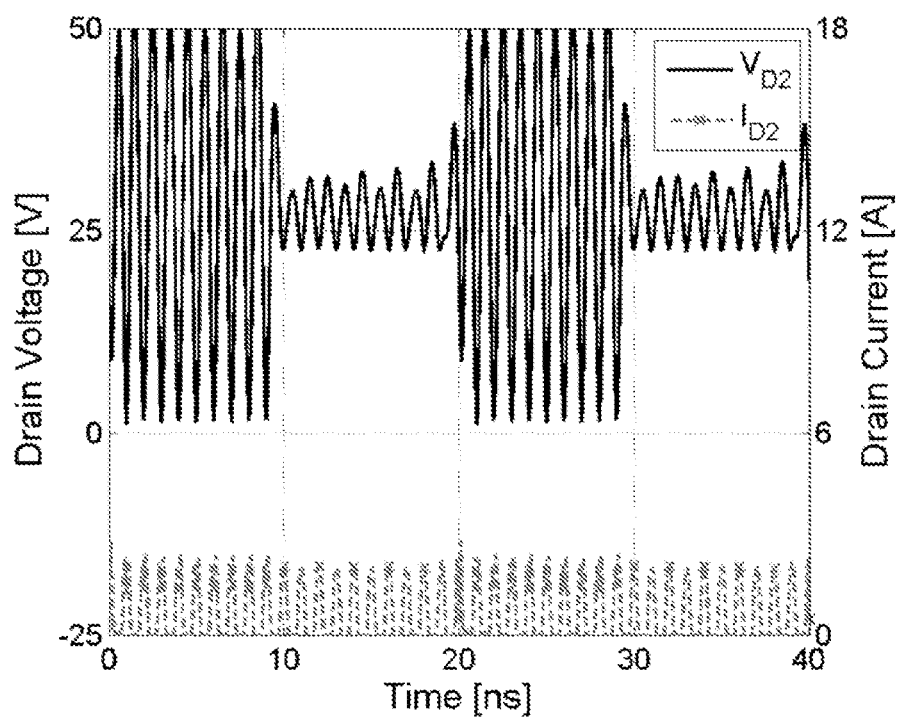
Figure 8G:
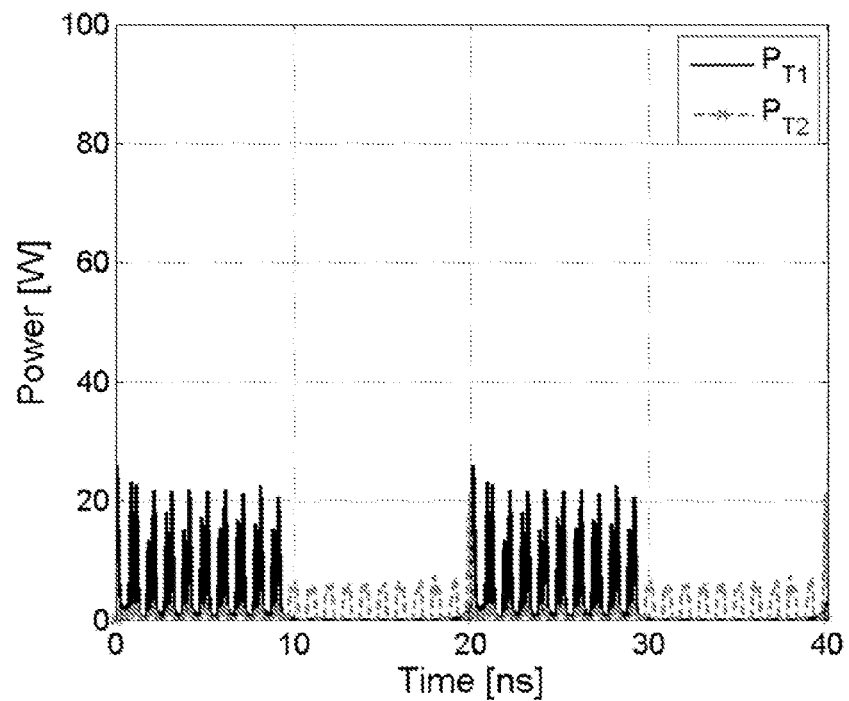
Figure 8H:
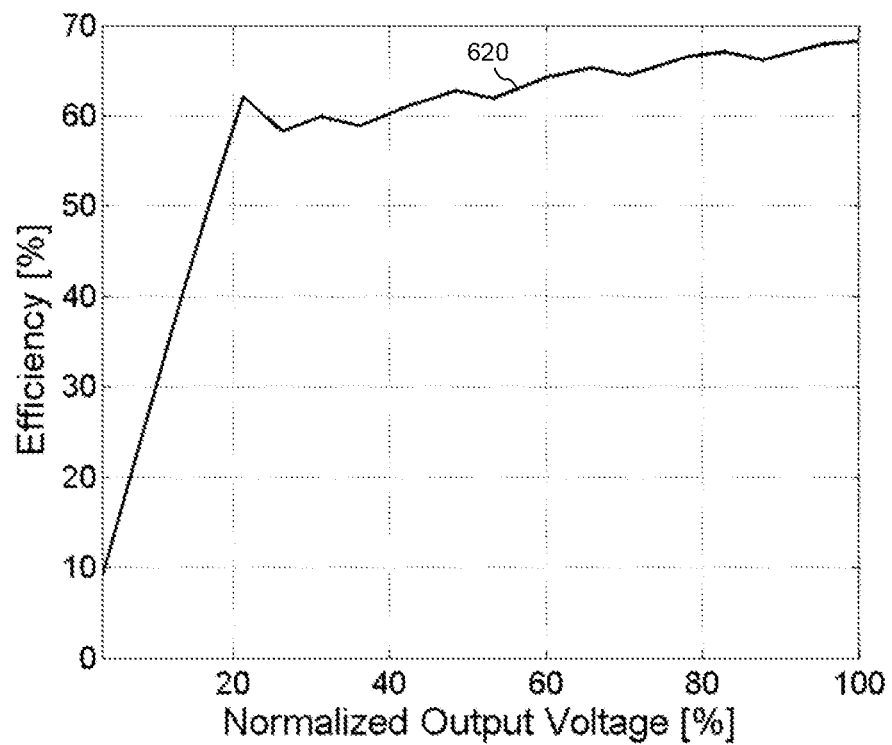

FIGS. 8d-g illustrate waveform diagrams associated with the operation of transistor 604 and 606. FIG. 8d illustrates drain voltage $V_{D1}$ and drain current $I_{D1}$ of transistor 604, FIG. 8e illustrates source voltage $V_{S1}$ and source current $I_{S1}$ of transistor 604, and FIG. 8f illustrates drain voltage $V_{D2}$ and drain current $I_{D2}$ of transistor 606. It can be seen that during the RF on-period the system 600 operates as a normal cascode amplifier and during the RF off-period only the upper section of the circuit including switch 610 and transistor 606 is active. Lower transistor 604 and the power supply 612 are bypassed by switch 610 and are in a standby mode during that time. FIG. 8g illustrates power loss $P_{T1}$ of transistor 604 and power loss $P_{T2}$ of transistor 606; and FIG. 8h illustrates efficiency 620 with respect to normalized output voltage.

In some embodiments, system 600 may incorporate concepts, systems and methods described in U.S. patent application Ser. No. 13/538,309 filed on Jun. 29, 2012 entitled "System and Method for a Cascoded Amplifier," which application is incorporated by reference herein in its entirety.

Figure 9A:
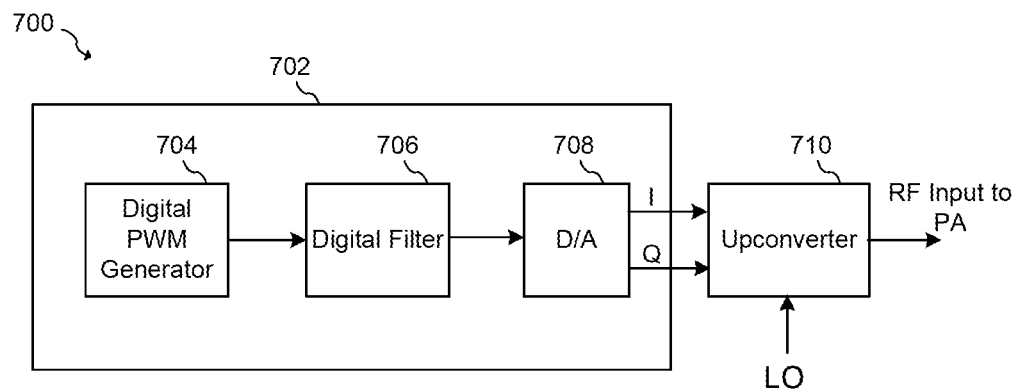
FIGS. 9a-b illustrate embodiment pulsewidth modulation generators.

FIG. 9a illustrates PWM generator 700 in which an embodiment predistortion filtering is performed in the digital domain. Digital PWM generator 704 generates a PWM signal that is filtered by digital filter 706. In an embodiment, digital filter 706 implements an embodiment predistortion filter transfer function as described in embodiments above. The digital output of digital filter 706 is converted into the analog domain via digital-to-analog (D/A) converter 708 having in-phase output I and quadrature output Q. In some embodiments, the output of D/A 708 is upconverted to a higher frequency with respect to local oscillator signal LO using upconverter 710. Alternatively, the RF input to the PA may be input from directly from D/A 708; however, in some embodiments, a band limiting filter and/or impedance matching network may be coupled between D/A 708 and the input of the PA. In some embodiments, digital PWM generator 704, digital filter 706 and D/A 708 may be disposed on integrated circuit 702. Alternatively, these blocks may be partitioned in a different manner using a plurality of board level circuits.

Figure 9B:
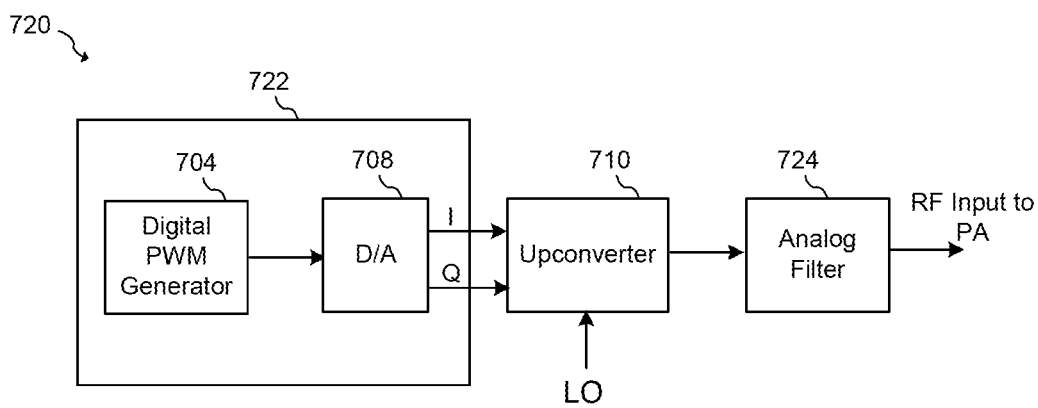

FIG. 9b illustrates PWM generator 720 according to an alternative embodiment. Here, digital PWM generator 704 and D/A converter 708 produce a baseband PWM signal that is upconverted according to local oscillator signal LO with upconverter 710. The output of upconverter is then filtered using analog filter 724. In some embodiments, analog filter 724 may precede upconverter 710. In other embodiments, analog filter 724, or portions of analog filter 724 may be incorporated within matching networks coupled to the input of embodiment power amplifier circuits described above. In some embodiments, digital PWM generator 704, and D/A 708 may be disposed on integrated circuit 722. Alternatively, these blocks may be partitioned in a different manner using a plurality of board level circuits.

In accordance with an embodiment, a system includes a first amplifier and a first bandpass filter having an input coupled in series with an output of the first amplifier and an output configured to be coupled to a load. The bandpass filter has a lower input impedance at an in-band center frequency than at out-of-band frequencies, and the first amplifier is configured to receive a pulse width modulated waveform filtered according to a first transfer function that attenuates sidebands of the pulse width modulated waveform. The first transfer function may be proportional to an inverse of a normalized impedance at the output of the first amplifier. The first amplifier may be implemented using a field effect transistor loaded by a bias inductor.

In some embodiments, the system also includes a second bandpass filter coupled to an input of the first amplifier, such that the second bandpass filter implements the first transfer function. The system may also include a signal generator coupled to an input of the first amplifier that is configured to generate the pulse width modulated waveform filtered according to a first transfer function. In some embodiments, the signal generator includes a digital filter configured to implement the first transfer function, and a pulse width modulator coupled to the digital filter.

In an embodiment, the system further includes a power switching circuit configured to operate the first amplifier at a first power consumption level when the pulse width modulator outputs a first signal level, and operate the first amplifier at a second power consumption level when the pulse width modulator outputs a second signal level. The second power consumption level is less than the first power consumption level. In some embodiments, the power switching circuit includes a variable power supply coupled to a power supply node of the amplifier and may include a bypass switch having a first output terminal coupled to the input of the first amplifier.

In an embodiment, the system further includes a second amplifier coupled in parallel with the first amplifier. The second amplifier has an input coupled to a second output terminal of the bypass switch, such that the bypass switch is configured to couple the first amplifier to the pulse width modulator when the pulse width modulator outputs the first signal level and to couple the second amplifier to the bypass switch when the pulse width modulator outputs the second signal level. In some embodiments, the first amplifier is coupled to a higher supply voltage than the second amplifier.

In an embodiment, the system further includes a plurality of further amplifiers coupled in parallel with the first amplifiers. The first amplifier and the plurality of further amplifiers may be configured to output a multi-level pulse width modulated signal. The plurality of further amplifiers may be coupled to different supply voltages, where the different supply voltages correspond to output levels of the multi-level pulse width modulated signal.

In accordance with a further embodiment, a power amplifier includes a first transistor having a first control node coupled to an input of the power amplifier, and an output filter having a filter input node coupled to a first output node of the first transistor and a filter output node configured to be coupled to a load. The first transistor is configured to receive a pulse width modulated signal, and the output filter has a lower input impedance at an in-band center frequency than at out-of-band frequencies. The power amplifier also includes a power switching circuit configured to a power switching circuit configured to operate the power amplifier at a first power consumption level when the pulse width modulated signal outputs a first signal level, and to operate the power amplifier at a second power consumption level when the pulse width modulated signal outputs a second signal level. The second power consumption level is less than the first power consumption level. In some embodiments, the output filter includes a series resonant circuit. The power amplifier may also include a parallel resonant tank circuit coupled to the output node of the first transistor.

In an embodiment, the power switching circuit includes a second transistor having a second output node coupled to the first output node of the first transistor, and a selection switch selectively coupling the first control node of the first transistor and the second control node of the second transistor to an input of the power amplifier. The selection switch may be configured to couple the first control node of the first transistor to the input of the power amplifier when the pulse width modulated signal outputs the first signal level. The selection switch may also be configured to couple the second control node of the second transistor to the input of the power amplifier when the pulse width modulated signal outputs the second signal level.

In an embodiment, the power amplifier may also include an input filter coupled to an input of the power amplifier. The filter is configured to attenuate sidebands of the pulse width modulated signal according to a first transfer function that is proportional to an inverse of a normalized impedance seen at the first output node of the first transistor. In some embodiments, the input filter may be implemented using a digital filter.

In an embodiment, the power amplifier further includes a signal generator configured to generate the pulse width modulated signal. The pulse width modulated signal may be filtered according to a first transfer function that is inversely proportional to a normalized impedance seen at the first output node of the first transistor.

In accordance with a further embodiment, a method of operating a power amplifier includes receiving an input pulse width modulated signal that is filtered according to a first transfer function, amplifying the input pulse width modulated signal using a first amplifier to form an amplified pulse width modulated signal, operating the first amplifier at a first power consumption level when the input pulse width modulated signal is at a first signal level, and operating the first amplifier at a second power consumption level when the input pulse width modulated signal is at a second signal level. The second power consumption level is less than the first power consumption level. The method also includes filtering the amplified pulse width modulated signal using a filter having a lower in-band impedance than an out of band impedance to form a filtered and amplified pulse width modulated signal, and coupling the filtered and amplified pulse width modulated signal to a load.

In an embodiment, first transfer function is inversely proportional to a normalized impedance at an output of the first amplifier. In some embodiments, the method further includes generating the input pulse width modulated signal. Operating the first amplifier at the second power consumption level may include reducing a bias voltage or a bias current of the first amplifier.

An advantage of embodiments includes the ability to generate PWM having a high efficiency at lower normalized output voltage levels. Further advantages include a compact circuit design due to close filter integration of filter, as well as less memory effects in the transistors due to reduced power loss.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
   a first amplifier;
   a first bandpass filter having an input coupled in series with an output of the first amplifier, and an output configured to be coupled to a load, the bandpass filter having a lower input impedance at an in-band center frequency than at out-of-band frequencies, wherein the first amplifier is configured to receive a pulse width modulated waveform filtered according to a first transfer function that attenuates sidebands of the pulse width modulated waveform; and
   a plurality of further amplifiers coupled in parallel with the first amplifier, wherein the first amplifier and the plurality of further amplifiers are configured to output a multi-level pulse width modulated signal.

2. The system of claim 1, further comprising a second bandpass filter coupled to an input of the first amplifier, the second bandpass filter implementing the first transfer function.

3. The system of claim 1, further comprising a signal generator coupled to an input of the first amplifier, the signal generator configured to generate the pulse width modulated waveform filtered according to the first transfer function.

4. The system of claim 3, wherein the signal generator comprises:
   a digital filter configured to implement the first transfer function; and
   a pulse width modulator coupled to the digital filter.

5. The system of claim 1, wherein the first transfer function is proportional to an inverse of a normalized impedance at the output of the first amplifier.

6. The system of claim 1, wherein the plurality of further amplifiers are coupled to different supply voltages, the different supply voltages corresponding to output levels of the multi-level pulse width modulated signal.

7. The system of claim 1, wherein the first amplifier comprises a field effect transistor loaded by a bias inductor.

8. A system comprising:
   a first amplifier;
   a first bandpass filter having an input coupled in series with an output of the first amplifier, and an output configured to be coupled to a load, the bandpass filter having a lower input impedance at an in-band center frequency than at out-of-band frequencies, wherein the first amplifier is configured to receive a pulse width modulated waveform filtered according to a first transfer function that attenuates sidebands of the pulse width modulated waveform; and
   a power switching circuit configured to
      operate the first amplifier at a first power consumption level when the pulse width modulated waveform has a first signal level, and
      operate the first amplifier at a second power consumption level when the pulse width modulated waveform has a second signal level, wherein the second power consumption level is less than the first power consumption level.

9. The system of claim 8, wherein the power switching circuit comprises a variable power supply coupled to a power supply node of the first amplifier.

10. The system of claim 8, wherein the power switching circuit comprises a bypass switch having a first output terminal coupled to the input of the first amplifier.

11. The system of claim 10, wherein the system further comprises a second amplifier coupled in parallel with the first amplifier, the second amplifier having an input coupled to a second output terminal of the bypass switch, wherein the bypass switch is configured to couple the first amplifier to the pulse width modulated waveform when the pulse width modulated waveform has the first signal level and to couple the second amplifier to the pulse width modulated waveform when the pulse width modulated waveform has the second signal level.

12. The system of claim 11, wherein the first amplifier is coupled to a higher supply voltage than the second amplifier.

13. The system of claim 8, further comprising a signal generator coupled to an input of the first amplifier, the signal generator configured to generate the pulse width modulated waveform filtered according to the first transfer function.

14. A power amplifier comprising:
   a first transistor having a first control node coupled to an input of the power amplifier, the first transistor configured to receive a pulse width modulated signal;
   an output filter having a filter input node coupled to a first output node of the first transistor and a filter output node configured to be coupled to a load, the output filter having a lower input impedance at an in-band center frequency than at out-of-band frequencies; and
   a power switching circuit configured to operate the power amplifier at a first power consumption level when the pulse width modulated signal outputs a first signal level, and to operate the power amplifier at a second power consumption level when the pulse width modulated signal outputs a second signal level, wherein the second power consumption level is less than the first power consumption level.

15. The power amplifier of claim 14, wherein the output filter comprises a series resonant circuit.

16. The power amplifier of claim 14, further comprising a parallel resonant tank circuit coupled to the output node of the first transistor.

17. The power amplifier of claim 14, wherein the power switching circuit comprises:
- a second transistor having a second output node coupled to the first output node of the first transistor; and
- a selection switch selectively coupling the first control node of the first transistor and a second control node of the second transistor to an input of the power amplifier.

18. The power amplifier of claim 17, wherein:
- the selection switch is configured to couple the first control node of the first transistor to the input of the power amplifier when the pulse width modulated signal outputs the first signal level; and
- the selection switch is configured to couple the second control node of the second transistor to the input of the power amplifier when the pulse width modulated signal outputs the second signal level.

19. The power amplifier of claim 14, further comprising an input filter coupled to an input of the power amplifier, the input filter configured to attenuate sidebands of the pulse width modulated signal according to a first transfer function.

20. The power amplifier of claim 19, wherein the first transfer function is proportional to an inverse of a normalized impedance seen at the first output node of the first transistor.

21. The power amplifier of claim 19, wherein the input filter comprises a digital filter.

22. The power amplifier of claim 14, further comprising a signal generator configured to generate the pulse width modulated signal.

23. The power amplifier of claim 22, wherein the pulse width modulated signal is filtered according to a first transfer function, the first transfer function being inversely proportional to a normalized impedance seen at the first output node of the first transistor.

24. A method of operating a power amplifier, the method comprising:
- receiving an input pulse width modulated signal that is filtered according to a first transfer function;
- amplifying the input pulse width modulated signal using a first amplifier to form an amplified pulse width modulated signal;
- operating the first amplifier at a first power consumption level when the input pulse width modulated signal is at a first signal level;
- operating the first amplifier at a second power consumption level when the input pulse width modulated signal is at a second signal level, wherein the second power consumption level is less than the first power consumption level;
- filtering the amplified pulse width modulated signal using a filter having a lower in-band impedance than an out of band impedance to form a filtered and amplified pulse width modulated signal; and
- coupling the filtered and amplified pulse width modulated signal to a load.

25. The method of claim 24, further comprising generating the input pulse width modulated signal.

26. The method of claim 24, wherein the first transfer function is inversely proportional to a normalized impedance at an output of the first amplifier.

27. The method of claim 24, wherein operating the first amplifier at the second power consumption level comprises reducing a bias voltage of the first amplifier.

* * * * *